US008035068B2

United States Patent
Ishigaki et al.

(10) Patent No.: US 8,035,068 B2
(45) Date of Patent: Oct. 11, 2011

(54) IMAGING DEVICE AND IMAGING APPARATUS

(75) Inventors: Tomoko Ishigaki, Kanagawa (JP);
Ryosuke Kasahara, Kanagawa (JP);
Toshiyuki Kawasaki, Kanagawa (JP);
Ippei Matsumoto, Kanagawa (JP);
Masahiro Fujimoto, Kanagawa (JP)

(73) Assignee: Ricoh Company, Limited, Tokyo (JP)

( * ) Notice: Subject to any disclaimer, the term of this patent is extended or adjusted under 35 U.S.C. 154(b) by 300 days.

(21) Appl. No.: 12/480,313

(22) Filed: Jun. 8, 2009

(65) Prior Publication Data
US 2010/0019129 A1    Jan. 28, 2010

(30) Foreign Application Priority Data

Jul. 28, 2008    (JP) .................................. 2008-193162

(51) Int. Cl.
*H01L 27/00*    (2006.01)

(52) U.S. Cl. ...................... 250/208.1; 250/226; 257/432; 348/273

(58) Field of Classification Search ............... 250/208.1, 250/214.1, 216, 226; 257/431, 432; 348/272, 348/273, 276, 281
See application file for complete search history.

(56) References Cited

U.S. PATENT DOCUMENTS

| | | | |
|---|---|---|---|
| 2003/0063204 A1 | 4/2003 | Suda | |
| 2003/0063210 A1 | 4/2003 | Tsuboi | |
| 2007/0221829 A1 | 9/2007 | Nakagawa et al. | |
| 2008/0159658 A1 | 7/2008 | Yun | |
| 2010/0002105 A1* | 1/2010 | Kasahara | 348/273 |

FOREIGN PATENT DOCUMENTS

| | | |
|---|---|---|
| EP | 1 936 692 | 6/2008 |
| JP | 2005-260067 | 9/2005 |
| JP | 2006-210701 | 8/2006 |
| JP | 2006-237737 | 9/2006 |
| JP | 2006-345054 | 12/2006 |
| JP | 2008-85807 | 4/2008 |

OTHER PUBLICATIONS

European Search Report issued Jul. 25, 2011 in EPA 09251737.4.

* cited by examiner

*Primary Examiner* — Kevin Pyo
(74) *Attorney, Agent, or Firm* — Oblon, Spivak, McClelland, Maier & Neustadt, L.L.P.

(57) ABSTRACT

A photoelectric conversion element includes a plurality of light receiving portions. A color filter is provided on a light receiving surface of the photoelectric conversion element with filters for red, green, and blue arranged corresponding to the light receiving portions, such that R, G, and B pixels including the light receiving portions and the filters are arranged in a two-dimensional array. A transfer unit transfers a light in a wavelength range other than lights of green and blue incident on the G pixel and a light in a wavelength range other than lights of blue and green incident on the B pixel to a neighboring R pixel.

18 Claims, 16 Drawing Sheets

← · — · — LIGHT IN RED WAVELENGTH RANGE
← — · — LIGHT IN GREEN WAVELENGTH RANGE
← ⎯⎯ LIGHT IN BLUE WAVELENGTH RANGE
← — — — LIGHT IN IR WAVELENGTH RANGE

FIG. 7A

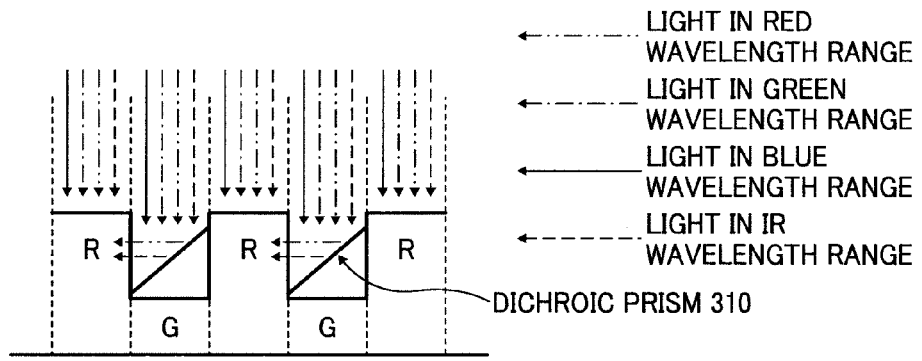

← — ·· — LIGHT IN RED WAVELENGTH RANGE
← — · — LIGHT IN GREEN WAVELENGTH RANGE
← ——— LIGHT IN BLUE WAVELENGTH RANGE
← - - - - LIGHT IN IR WAVELENGTH RANGE

DICHROIC PRISM 310

FIG. 7B

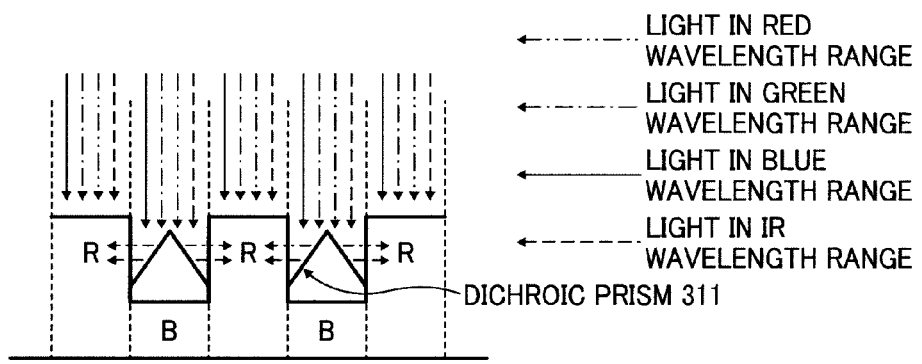

← — ·· — LIGHT IN RED WAVELENGTH RANGE
← — · — LIGHT IN GREEN WAVELENGTH RANGE
← ——— LIGHT IN BLUE WAVELENGTH RANGE
← - - - - LIGHT IN IR WAVELENGTH RANGE

DICHROIC PRISM 311

FIG. 8

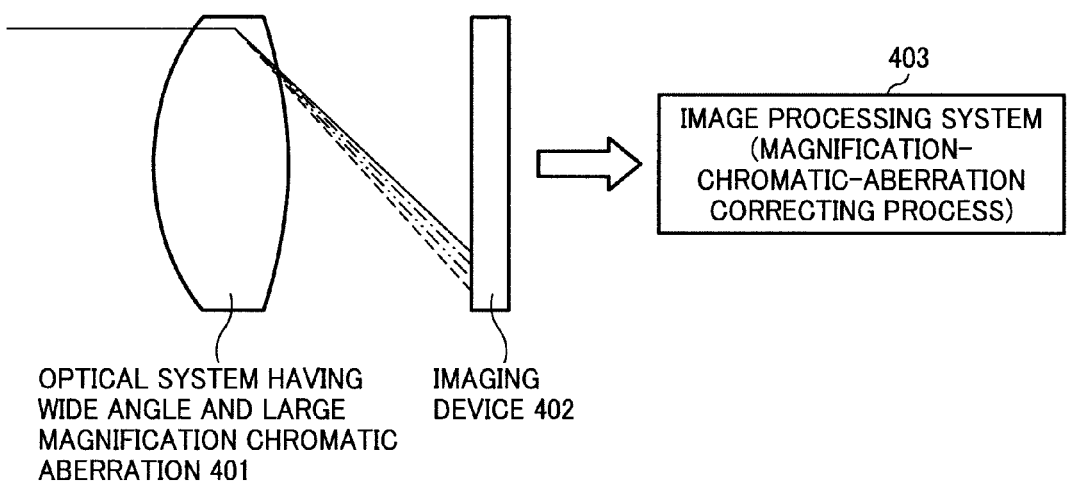

OPTICAL SYSTEM HAVING WIDE ANGLE AND LARGE MAGNIFICATION CHROMATIC ABERRATION 401

IMAGING DEVICE 402

IMAGE PROCESSING SYSTEM (MAGNIFICATION-CHROMATIC-ABERRATION CORRECTING PROCESS) 403

ENTIRE IMAGE (SQUARES INDICATE PIXELS)

ACTUAL SHOOTING POSITION
(RED, GREEN, AND BLUE
CHANNELS IN ORDER
FROM SECOND FROM TOP
TOP: LIGHT IN IR WAVELENGTH
RANGE TRANSMITS THROUGH
COLOR FILTER AND APPEARS
IN CAPTURED IMAGE
AS COLOR SIGNAL OF
TRANSMITTED COLOR FILTER)

G-SIGNAL

R-SIGNAL

B-SIGNAL

FIG. 15

| 0 | -0.5 | 0 | -0.5 | 0 |
|---|---|---|---|---|
| -0.5 | 0 | -1.0 | 0 | -0.5 |
| 0 | -1.0 | 9.0 | -1.0 | 0 |
| -0.5 | 0 | -1.0 | 0 | -0.5 |
| 0 | -0.5 | 0 | -0.5 | 0 |

FIR FILTER

FIG. 16A

|   | 0 | 1 | 2 | 3 | 4 | 5 |
|---|---|---|---|---|---|---|
| 0 | G | B | G | B | G | B |
| 1 | R | G | R | G | R | G |
| 2 | G | B | G | B | G | B |
| 3 | R | G | R | G | R | G |
| 4 | G | B | G | B | G | B |
| 5 | R | G | R | G | R | G |

FIG. 16B

|   | 0 | 1 | 2 | 3 | 4 | 5 |
|---|---|---|---|---|---|---|
| 0 | G | B | G | B | G | B |
| 1 | R | G | R | G | R | G |
| 2 | G | B | G | B | G | B |
| 3 | R | G | R | G | R | G |
| 4 | G | B | G | B | G | B |
| 5 | R | G | R | G | R | G |

|   | 0 | 1 | 2 | 3 | 4 | 5 |
|---|---|---|---|---|---|---|
| 0 | G(0) | B(1) | G(0) | B(1) | G(0) | B(1) |
| 1 | R(2) | G(3) | R(2) | G(3) | R(2) | G(3) |
| 2 | G(0) | B(1) | G(0) | B(1) | G(0) | B(1) |
| 3 | R(2) | G(3) | R(2) | G(3) | R(2) | G(3) |
| 4 | G(0) | B(1) | G(0) | B(1) | G(0) | B(1) |
| 5 | R(2) | G(3) | R(2) | G(3) | R(2) | G(3) |

FIG. 20A
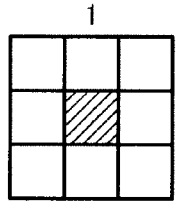
X1=rX
Y1=rY
FIG. 20B
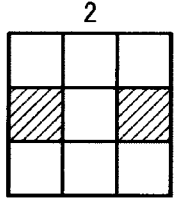
WHEN dX>0,
X2=rX+1
OTHERWISE,
X2=rX-1, Y2=rY
FIG. 20C
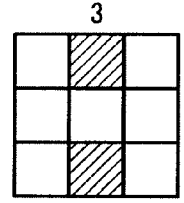
X3=rX
WHEN dY>0,
Y3=rY+1
OTHERWISE,
Y3=rY-1
FIG. 20D
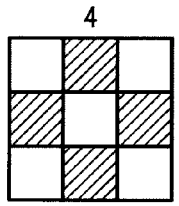
WHEN dX>0,
X4=rX+1
OTHERWISE,
X4=rX-1, Y4=rY
FIG. 20E
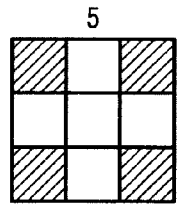
WHEN dX>0, X5=rX+1
OTHERWISE, X5=rX-1
WHEN dY>0, Y5=rY+1
OTHERWISE, Y5=rY-1
FIG. 21
| ARRAY VALUE | SET OF X, Y IN OUTPUT |
|---|---|
| 0 | R → 3<br>G → 1<br>B → 2 |
| 1 | R → 5<br>G → 4<br>B → 1 |
| 2 | R → 1<br>G → 4<br>B → 5 |
| 3 | R → 2<br>G → 1<br>B → 3 |

FIG. 22
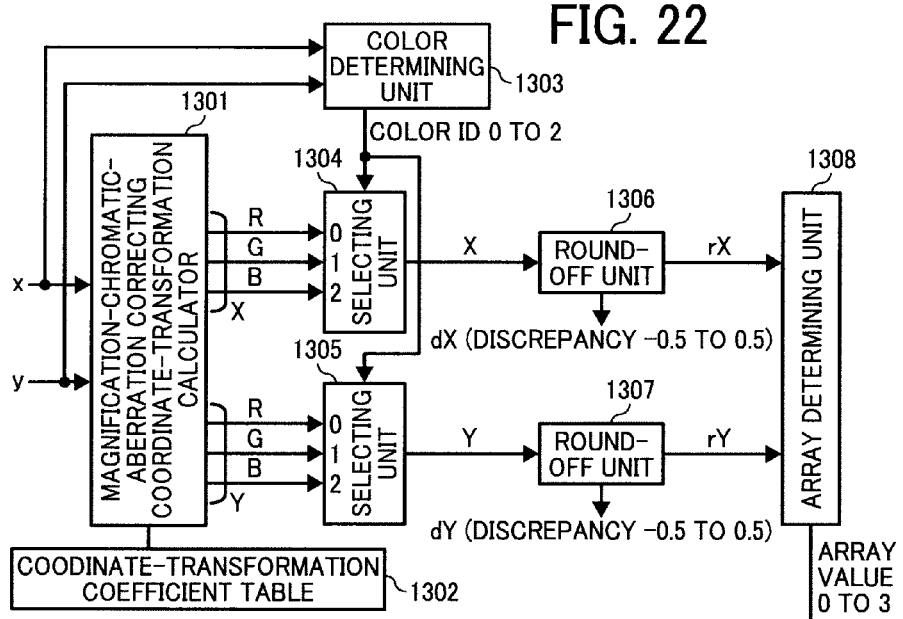
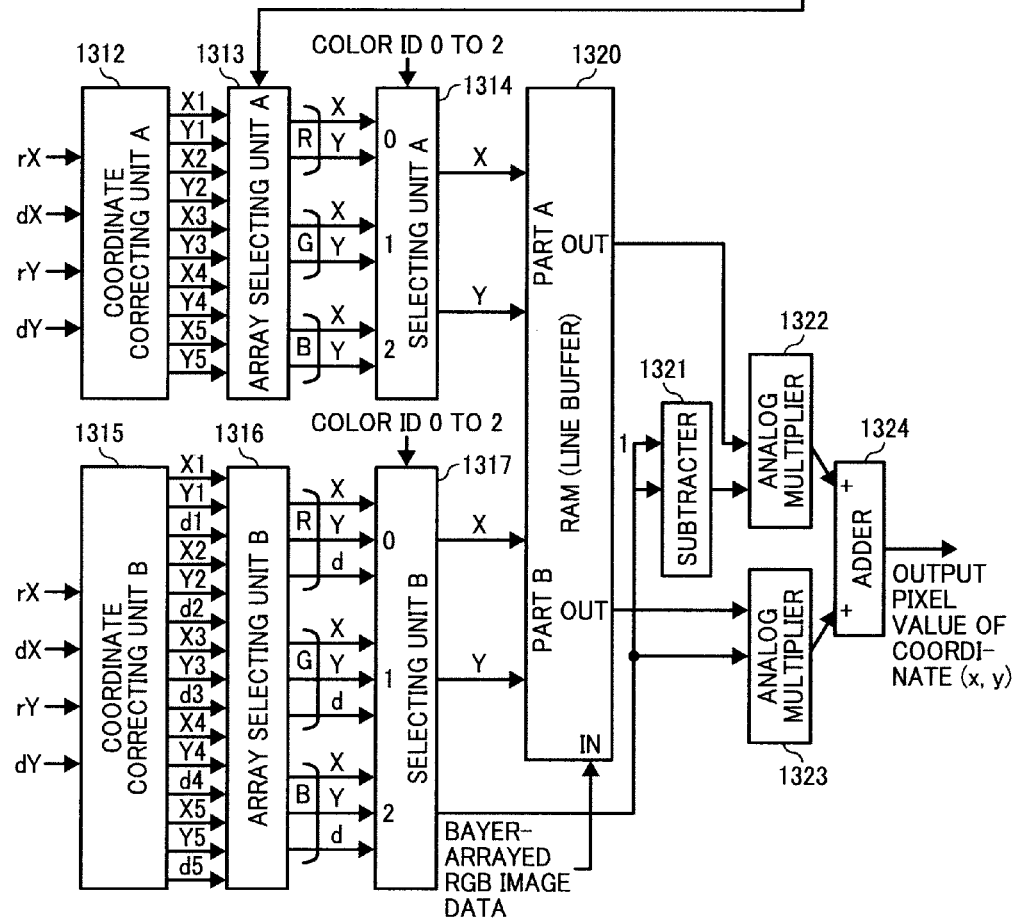

X1=rX
Y1=rY

X2=rX-1
Y2=rY

X3=rX
Y3=rY-1

X4=rX-1
Y4=rY

X5=rX-1
WHEN dY>0, Y5=rY+1
OTHERWISE, Y5=rY-1

X1=rX
Y1=rY
d1=0

X2=rX+1
Y2=rY
d2=dX+0.5

X3=rX
Y3=rY+1
d3=dY+0.5

X4=rX+1
Y4=rY
d4=dX+0.5

X5=rX+1
WHEN dY>0, Y5=rY+1
OTHERWISE, Y5=rY-1
d5=dX+0.5

1

X1=rX
Y1=rY

2

X2=rX−1
Y2=rY

3

X3=rX
WHEN dY>0, Y3=rY+1
OTHERWISE, Y3=rY−1

4

X4=rX−1
Y4=rY

5

X5=rX−1
WHEN dY>0, Y5=rY+1
OTHERWISE, Y5=rY−1

1

X1=rX
Y1=rY
d1=0

2

X2=rX+1
Y2=rY
d2=dX+0.5

3

X3=rX
WHEN dY>0, Y3=rY+1
OTHERWISE, Y3=rY−1
d3=0

4

X4=rX+1
Y4=rY
d4=dX+0.5

5

X5=rX+1
WHEN dY>0, Y5=rY+1
OTHERWISE, Y5=rY−1
d5=dX+0.5

IMAGING DEVICE AND IMAGING APPARATUS

CROSS-REFERENCE TO RELATED APPLICATIONS

The present application claims priority to and incorporates by reference the entire contents of Japanese priority document 2008-193162 filed in Japan on Jul. 28, 2008.

BACKGROUND OF THE INVENTION

1. Field of the Invention

The present invention relates to an imaging device that converts an image into an electric signal and an imaging apparatus using the imaging device.

2. Description of the Related Art

A common imaging device widely used heretofore includes three kinds of color filters of R, G, and B. Generally, the R, G, B color filters transmit light in an IR wavelength range. Therefore, when the light transmitted through the R, G, B color filters is detected by a photoelectric conversion element to generate R, G, B color image data, color reproducibility thereof is low.

Therefore, in the imaging device using the R, G, B color filters, an IR cut filter is provided in front of the imaging device so that the light transmitted through the R, G, and B color filters does not include the light in the IR wavelength range, thereby improving the color reproducibility. However, the IR cut filter not only cuts the light in the IR wavelength range but also attenuates visible light by about 10% to 20%. Therefore, intensity of light in a visible wavelength range entering into a light receiving pixel decreases, to thereby reduce sensitivity.

As a corrective action against these problems, there is such a method that an imaging device in which half the number of G filters in a Bayer array is replaced by IR filters corrects a signal output from an IR light receiving pixel as a signal amount generated in each light receiving pixel due to the light in the IR wavelength range. This method can improve reduction in sensitivity, while maintaining the color reproducibility. However, because the number of G pixels decreases, resolution is reduced. Further, because the signal is offset as the signal amount generated in each light receiving pixel due to the light in the IR wavelength range at the time of correction, the signal-to-noise (S/N) ratio decreases.

As an application of the imaging device, an imaging device as shown in FIG. 28 has been proposed. This is an imaging device in which a portion of R filters in the Bayer array is selectively replaced by the IR filters, which performs the correction (see Japanese Patent Application Laid-open No. 2006-237737). In this case, although the number of R pixels decreases, reduction of the resolution is relatively small, because of a principle that even if the number of R pixels is increased, the resolution can be hardly improved. However, reduction of the S/N ratio cannot be avoided due to the same reason at the time of correction.

As another corrective action, an imaging device having a configuration including R, G, B color filters, a photoelectric conversion layer, and photoelectric conversion elements sequentially in an optical path guided from an optical system, and an image processor using the imaging device have been designed. In this image processor, at least the R filter also transmits the light in the IR wavelength range, the photoelectric conversion layer absorbs the light in the IR wavelength range to generate electric charge corresponding thereto and transmits light in other ranges, and some of the photoelectric conversion elements correspond to the R filter. This is a method of using R, G, B color image signals and a signal of the light in the IR wavelength range output from the imaging device to perform image processing, thereby improving the color reproducibility of the color image signal (see Japanese Patent Application Laid-open No. 2008-085807).

In this method, reduction of sensitivity and resolution is prevented, while maintaining the color reproducibility. However, because arithmetic (subtraction) processing for the R, G, B color image signals and the signal of the light in the IR wavelength range is performed by the image processing, the S/N ratio decreases. Further, because the photoelectric conversion layer needs to satisfy a composition with the corresponding characteristic, and the imaging device including the photoelectric conversion layer has a complicated structure, it is hard to say that this method is optimal.

Further, in any method described above, an amount of light is absorbed by the R, G, and B color filters. For example, the R filter absorbs light in a blue wavelength range and light in a green wavelength range. Currently, reduction in the sensitivity due to absorption of light cannot be avoided.

Thus, there has been no imaging device that has all of satisfactory color reproducibility, sensitivity, and resolution.

Recently, demands for a wide-angle small imaging apparatus have been increasing for an application such as a back monitor of a vehicle. However, it is difficult to design a small optical system with a small aberration and distortion, and performance needs to be improved in combination with image processing. For example, in Japanese Patent Application Laid-open No. 2006-345054 is described a method of correcting a magnification chromatic aberration generated in an optical system, in an imaging apparatus using an optical system having a distortion, by performing coordinate transformation for each of R (red), G (green), and B (blue) signals obtained by an imaging device such as a charge coupled device (CCD) and a complimentary metal oxide semiconductor (CMOS) to generate different distortion.

Generally, a color filter such as of a Bayer array is provided in the imaging device. In the conventional art, after a defective pixel due to the color filter array such as the Bayer array is interpolated, the magnification chromatic aberration is corrected with respect to a signal obtained by the imaging device.

However, to correspond to an optical system having a large magnification chromatic aberration, a quite large memory capacity is required for the magnification chromatic aberration (for coordinate transformation), and the device becomes very expensive. Further, because the magnification chromatic aberration is different for each color component, a memory capable of addressing independently for each color component is required for correction of the magnification chromatic aberration, and it is necessary to use an expensive 3-port random access memory (RAM) (for example, a static RAM (SRAM)) having a 3-chip configuration or to drive a RAM in a time-sharing manner, which makes the device even more expensive.

SUMMARY OF THE INVENTION

It is an object of the present invention to at least partially solve the problems in the conventional technology.

According to one aspect of the present invention, there is provided an imaging device including a photoelectric conversion element including a plurality of light receiving portions; a color filter provided on a light receiving surface of the photoelectric conversion element with filters for wavelength ranges of red, green, and blue arranged corresponding to the light receiving portions, such that R, G, and B pixels including the light receiving portions and the filters are arranged in a two-dimensional array; and a transfer unit that transfers a light in a wavelength range other than lights in wavelength ranges of green and blue incident on the G pixel and a light in a wavelength range other than lights in wavelength ranges of blue and green incident on the B pixel to a neighboring R pixel.

Furthermore, according to another aspect of the present invention, there is provided an imaging apparatus including an imaging device that includes a photoelectric conversion element including a plurality of light receiving portions, a color filter provided on a light receiving surface of the photoelectric conversion element with filters for wavelength ranges of red, green, and blue arranged corresponding to the light receiving portions, such that R, G, and B pixels including the light receiving portions and the filters are arranged in a two-dimensional array, and a transfer unit that transfers a light in a wavelength range other than lights in wavelength ranges of green and blue incident on the G pixel and a light in a wavelength range other than lights in wavelength ranges of blue and green incident on the B pixel to a neighboring R pixel; an imaging optical system that forms an image on the imaging device; and an image processing system that processes image data output from the imaging device.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIGS. 7A and 7B are sectional views along lines a and b shown in FIG. 6, respectively;

FIG. 8 is a system configuration example of an imaging apparatus according to the present invention;

FIG. 15 is an example an FIR filter;

FIGS. 16A and 16B are schematic diagrams for explaining the principle of correction of magnification chromatic aberration of the present invention;

FIGS. 20A to 20E depict a content of calculation performed by a coordinate correcting unit shown in FIG. 17;

FIG. 21 depicts an operation by the array determining unit;

FIG. 22 is an overall configuration diagram of the magnification-chromatic-aberration correcting unit shown in FIG. 12 in a second example;

DETAILED DESCRIPTION OF THE PREFERRED EMBODIMENTS

Exemplary embodiments of the present invention will be explained in detail below with reference to the accompanying drawings.

Figure 1:
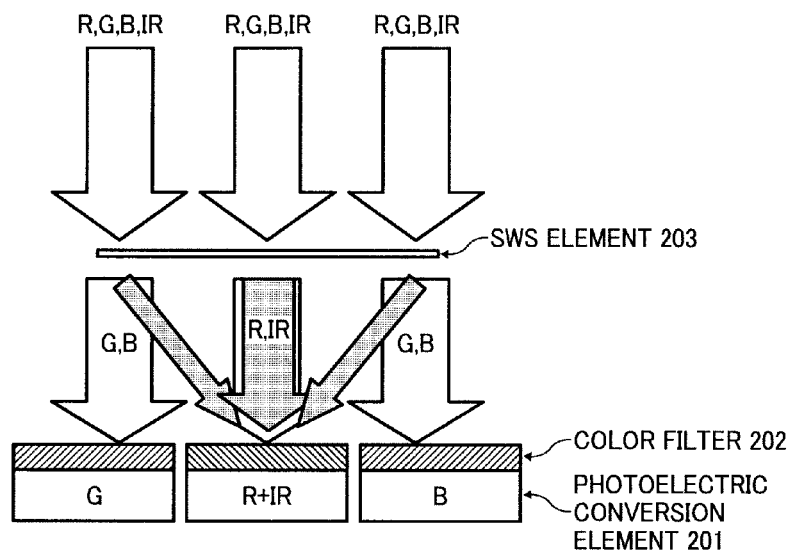
FIG. 1 is a schematic configuration diagram of a first configuration example of an imaging device according to the present invention.

FIG. 1 is a first configuration example of an imaging device according to the present invention.

This imaging device includes a photoelectric conversion element 201 having a plurality of light receiving portions (photoelectric conversion layers) and a color filter 202 provided on a light receiving surface of the photoelectric conversion element 201, in which filters of wavelength ranges of red (R), green (G), and blue (B) are arranged corresponding to the light receiving portions. In the imaging device, R, G, B pixels including the light receiving portion and the filter are two-dimensionally arrayed. An SWS element 203 having a sub-wavelength structure is provided above the pixels of the imaging device so that lights in the red wavelength range and an IR wavelength range entering into the G pixel and the B pixel are transferred to the neighboring R pixels. The R filter in the color filter 202 transmits the lights (R+IR) in the red wavelength range and IR wavelength range.

The SWS element has a function as a wave plate, which forms a periodic structure having a pitch smaller than that of the used wavelength on a surface of an element such as a transparent substrate, and has an effect of diffracting the light of a specific wavelength (here, lights in the red wavelength range and infrared (IR) wavelength range).

Figure 2:
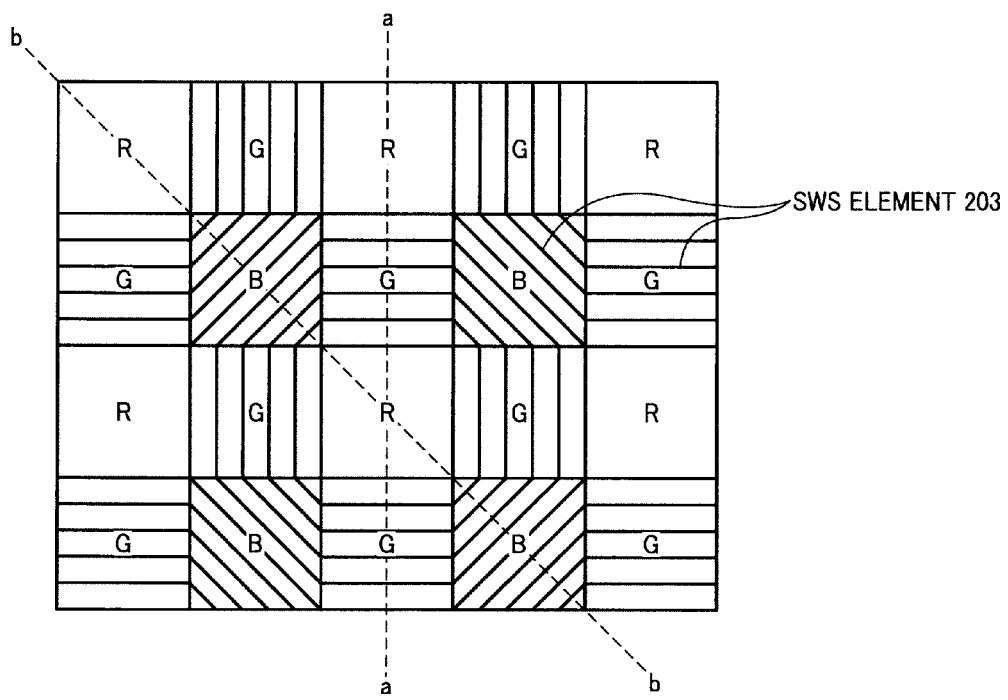
FIG. 2 is a two-dimensional pixel array diagram when the imaging device of a Bayer array is used in the configuration shown in FIG. 1.
Figure 3A:
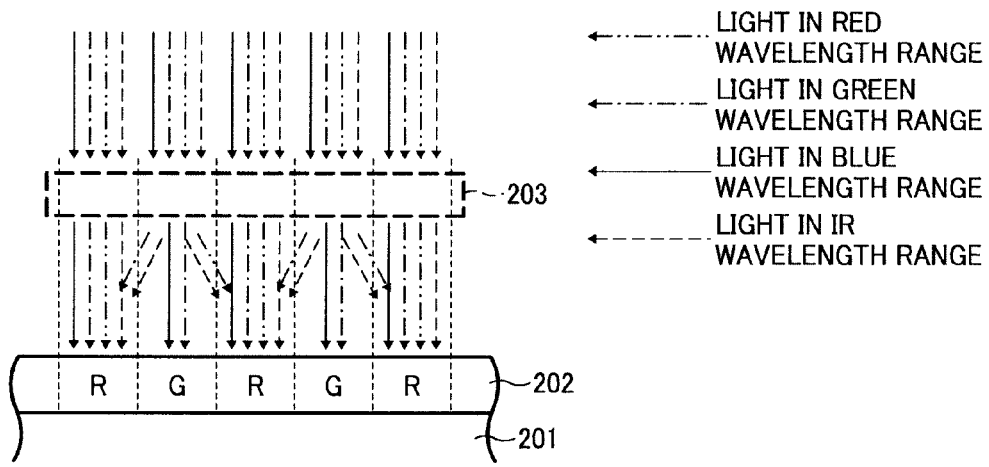
FIGS. 3A and 3B are sectional views along lines a and b shown in FIG. 2, respectively.
Figure 3B:
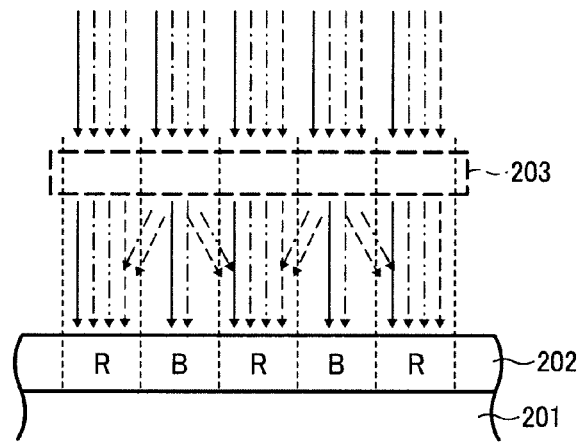

FIG. 2 is a two-dimensional pixel array diagram when the imaging device of the Bayer array is used in the configuration as shown in FIG. 1. FIGS. 3A and 3B are sectional views along lines a and b in FIG. 2, respectively.

Arrows with solid line, one-dot chain line, two-dot chain line, and broken line in FIGS. 3A and 3B indicate transfer routes of the lights in the respective wavelength ranges. The light in the red wavelength range and the light in the IR wavelength range transferred from the B pixel are condensed on a diagonal of the R pixel at a transfer destination. This is for preventing the light in the IR wavelength range transferred from the B pixel from being mixed in the G pixel to improve the color reproducibility.

By having such a configuration, the entire light in the red wavelength range and the entire light in the IR wavelength range entering into the surface of the imaging device can be obtained as a red signal, thereby enabling to improve the sensitivity.

Further, because the light in the IR wavelength range mixed in the G pixel or the B pixel can be removed, the color reproducibility can be improved. An influence of the light in the IR wavelength range that is largely refracted due to the magnification chromatic aberration, forms an image on the imaging device, and is converted to a green signal or blue signal in the G pixel or B pixel at the imaging point can be reduced. Accordingly, a point spread function (PSF) decreases, and resolution can be improved.

Figure 4:
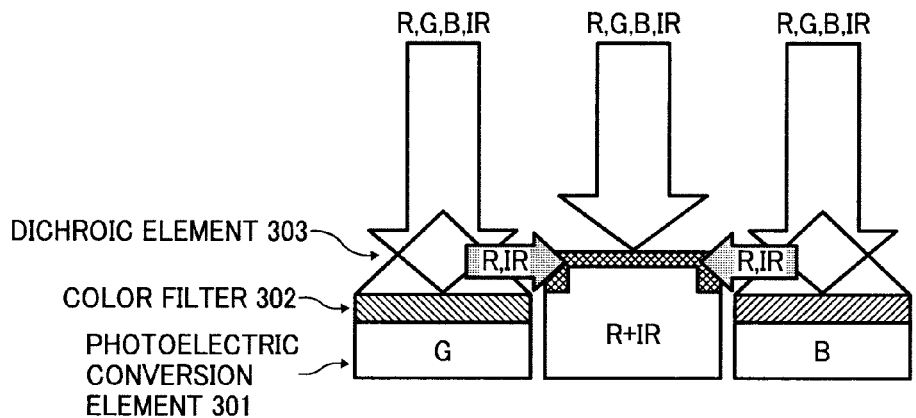
FIG. 4 is a schematic configuration diagram of a second configuration example of the imaging device according to the present invention.

FIG. 4 is a second configuration example of the imaging device according to the present invention.

This imaging device includes a photoelectric conversion element 301 having a plurality of light receiving portions (photoelectric conversion layers) and a color filter 302, in which filters in the wavelength ranges of red (R), green (G), and blue (B) are arranged corresponding to the light receiving portions provided on the light receiving surface of the photoelectric conversion element 301. In the imaging device, R, G, and B pixels including the light receiving portion and the filter are two-dimensionally arrayed. A dichroic element (dichroic prism or flat plate including a dichroic film) 303 is provided above the pixels of the imaging device so that lights in the red wavelength range and IR wavelength range entering into the G pixel and the B pixel are transferred to the neighboring R pixels. The R filter in the color filter 302 transmits the lights (R+IR) in the red wavelength range and IR wavelength range.

The dichroic element (dichroic prism or flat plate including the dichroic film) 303 transmits the light in a certain wavelength range and reflects the light in the other wavelength ranges, and uses a thin film for transmitting or reflecting the light of a specific wavelength.

Figure 5:
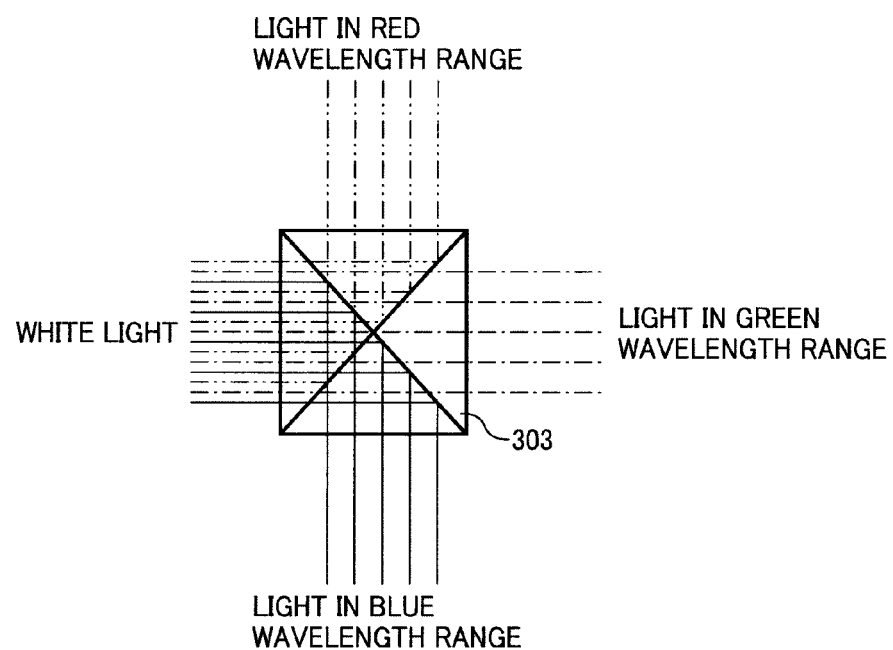
FIG. 5 is a plan view of a dichroic prism, which is one example of a dichroic element, as seen from above.

FIG. 5 is a plan view of a dichroic prism, which is one example of the dichroic element 303, as seen from above. As shown in FIG. 5, the one having a structure in which two reflecting surfaces cross each other is used for a liquid crystal projector and the like. The dichroic prism also functions as a filter for separating white light into three types of lights, that is, the light in the red wavelength range, the light in the green wavelength range, and the light in the blue wavelength range, by setting different transmission wavelength ranges on the two surfaces.

In the example of the imaging device shown in FIG. 4, an R(+IR) pixel is protruded upward relative to the G pixel and the B pixel, and can receive the light (R+IR) in the red wavelength range and IR wavelength range reflected and transferred by the dichroic element (for example, dichroic prism) 303.

As a manufacturing method for such an imaging device, depressions are formed by etching B pixel and G pixel portions on a semiconductor substrate constituting the photoelectric conversion element, and the B filter and the G filter are formed in the depressions, and the R filter (R+IR filter) is formed on a protrusion. The manufacturing method is specifically explained below.

FIGS. 27A to 27G are a process chart of one example of the manufacturing method for the imaging device.

Figure 27A:
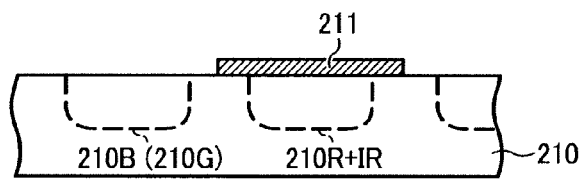
FIGS. 27A to 27G are a process chart of one example of a manufacturing method for the imaging device.
Figure 27B:

Two-dimensionally arrayed light receiving portions are first formed on a semiconductor substrate 210 by impurity diffusion or the like. As shown in FIG. 27A, an etching mask 211 is formed to cover a portion to be a light receiving portion 210R+IR for the light in the R+IR wavelength range according to a photolithographic technique, and then etching is performed. As shown in FIG. 27B, a depression is formed in a portion, which is a light receiving portion 210B (210G) for the light in the blue wavelength range (or green wavelength range) by the etching.

Figure 27C:
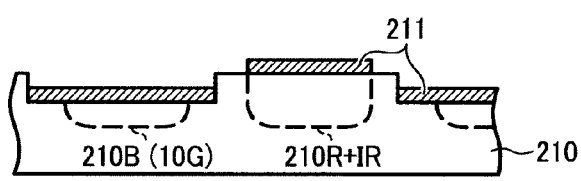
Figure 27D:
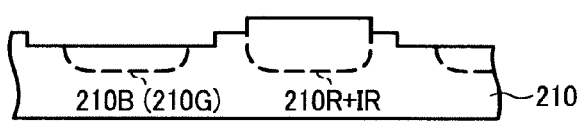

As shown in FIG. 27C, the etching mask 211 is formed on the light receiving portion 210R+IR for the light in the R+IR wavelength range except for the circumference thereof according to the photolithographic technique, and the etching is performed. As shown in FIG. 27D, a step is formed around the light receiving portion 210R+IR by the etching.

Figure 27E:
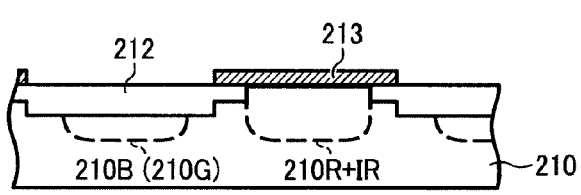
Figure 27F:
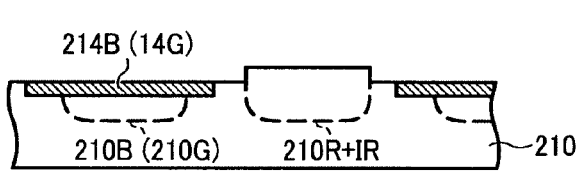

As shown in FIG. 27E, a photosensitive resin 212 colored in blue (or green) is applied to the semiconductor substrate using a method such as spin coating, exposed using a photomask 213 patterned to cover portions other than the depression of the light receiving portion 210B (210G) for the light in the blue wavelength range (or green wavelength range), and developed. The photosensitive resin is patterned to remain only on the depression to thereby form a B filter (or G filter) 214B (214G), as shown in FIG. 27F, by this exposure and development process. The B filter (or G filter) 214B (214G) is embedded in the depression, and a film thickness of the B filter (or G filter) 214B (214G) is set so that the upper surface thereof is the same height as the step around the light receiving portion 210R+IR, for example.

Figure 27G:
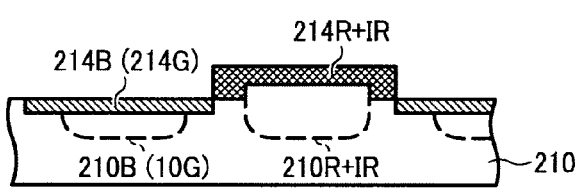
Figure 28:
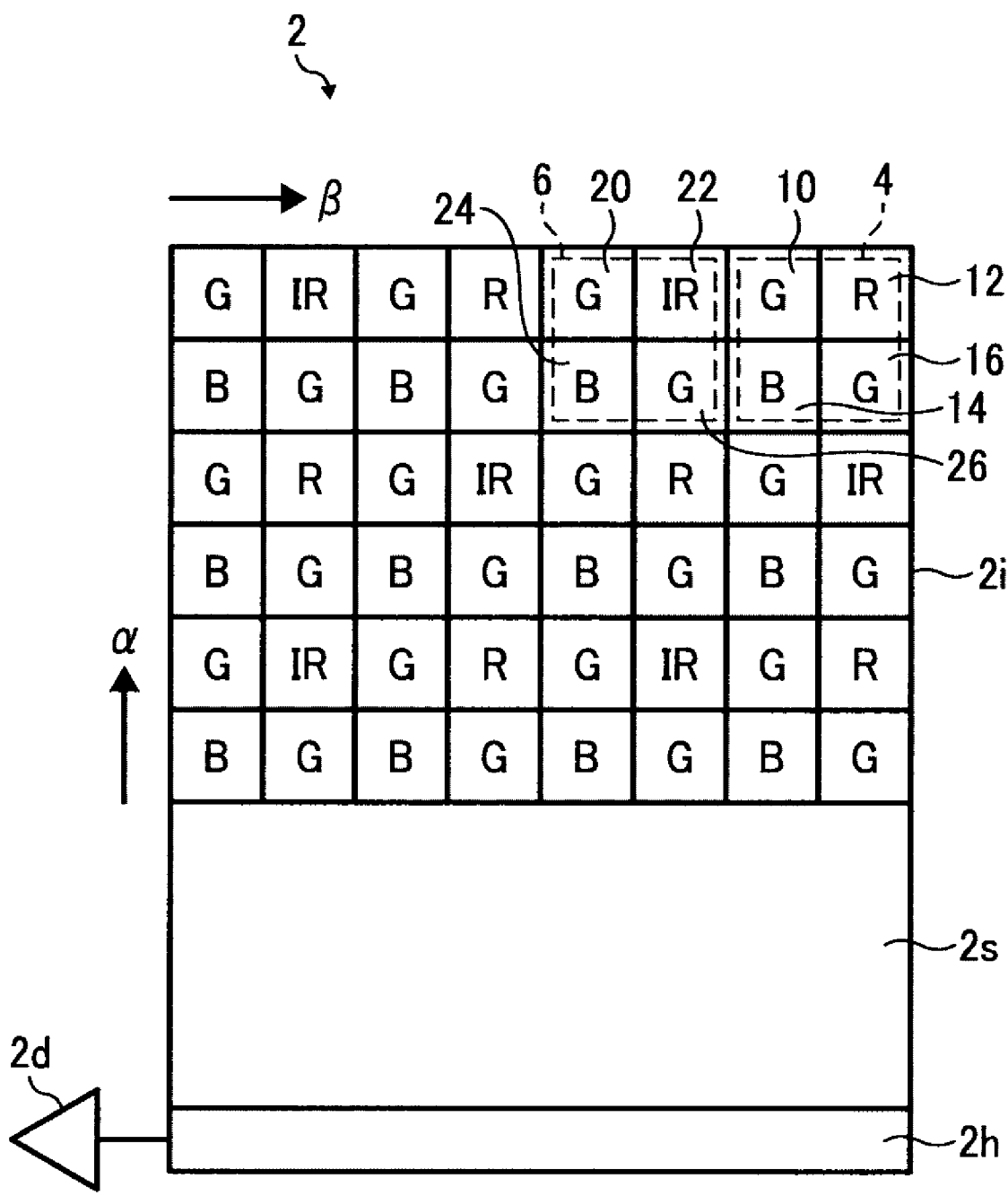
FIG. 28 is a configuration example of a conventional imaging device.

A photosensitive resin colored in red is applied to the semiconductor substrate using the method such as the spin coating in the same manner, exposed using a photomask patterned to cover portions excluding the light receiving portion 210R+IR for the light in the R+IR wavelength range and the step therearound, and developed. The photosensitive resin is patterned to remain only in the light receiving portion 210R+IR for the light in the R+IR wavelength range and the step therearound by the exposure and development process, to thereby form an R+IR filter 214R+IR, as shown in FIG. 27G.

Because an R+IR pixel including the R+IR light receiving portion 210R+IR and the R+IR filter 214R+IR formed in this manner is protruded upward relative to the G pixel and the B pixel, the lights (R+IR) in the red wavelength range and IR wavelength range reflected and transmitted by the dichroic element (for example, dichroic prism) can be transmitted through the R+IR filter 214R+IR and received by the R+IR light receiving portion 210R+IR.

Figure 6:
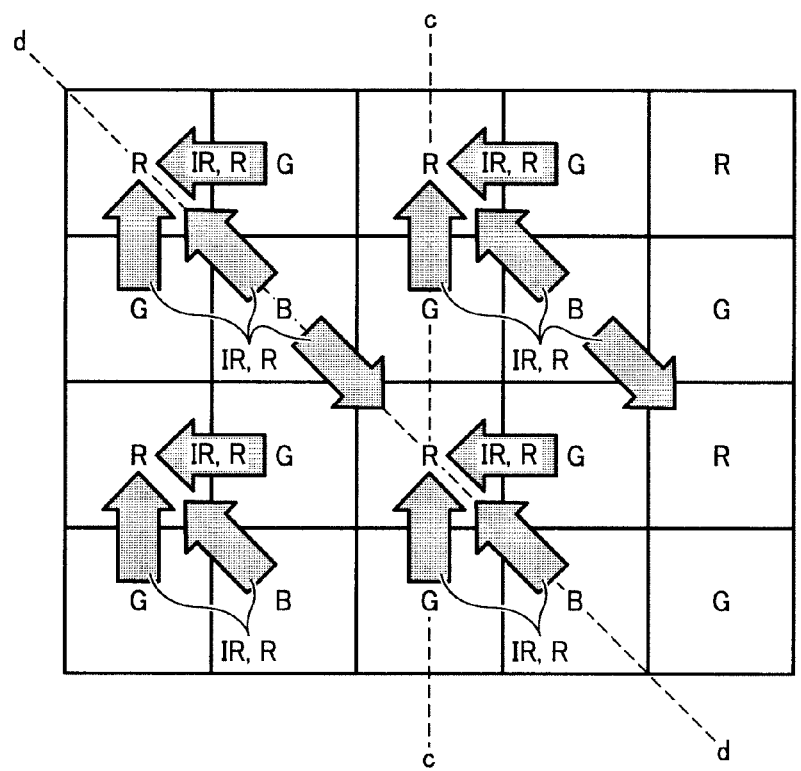
FIG. 6 is a two-dimensional pixel array diagram when the imaging device of the Bayer array is used in the configuration shown in FIG. 4.

FIG. 6 is a two-dimensional pixel array diagram when the imaging device of the Bayer array is used in the configuration shown in FIG. 4. FIGS. 7A and 7B are sectional views along lines c and d in FIG. 6, respectively.

Arrows with solid line, one-dot chain line, two-dot chain line, and broken line in FIGS. 7A and 7B indicate routes (transfer routes) of the lights in the respective wavelength ranges. Dichroic prisms 310 and 311 are used as transfer means for the lights (R+IR) in the red wavelength range and in the IR wavelength range.

The light in the red wavelength range and the light in the IR wavelength range transferred from the B pixel in FIG. 6 are condensed on a diagonal of the R pixel at the transfer destination. This is for preventing the light in the IR wavelength range transferred from the B pixel from being mixed in the G pixel to improve the color reproducibility.

By having such a configuration, the entire light in the red wavelength range and the entire light in the IR wavelength range entering into the surface of the imaging device can be obtained as a red signal, thereby enabling to improve the sensitivity.

Further, because the light in the IR wavelength range mixed in the G pixel or B pixel can be removed, the color reproducibility can be improved. An influence of the light in the IR wavelength range that is largely refracted due to the magnification chromatic aberration, forms an image on the imaging device, and is converted to the green signal or blue signal in the G pixel or B pixel at the imaging point can be reduced. Accordingly, the PSF decreases and resolution can be improved.

An imaging apparatus according to the present invention is explained next.

The imaging apparatus includes the imaging device explained in the first or second example, an imaging optical system that forms an image on the imaging device, and an image processing system that processes image data output from the imaging device.

Like a system configuration example of the imaging apparatus shown in FIG. 8, when an optical system 401 having a wide angle and a large magnification chromatic aberration is used as the imaging optical system, an image processing system 403 performs a magnification-chromatic-aberration correcting process with respect to luminance of the G pixel, the B pixel, and the R pixel including the light in the IR wavelength range of an imaging device 402.

An optical system having a wide angle and a small magnification chromatic aberration has a defect that the system becomes large and expensive. However, by using the above system configuration, the magnification chromatic aberration can be suppressed, and an image having high sensitivity and resolution can be realized by a small and low-cost optical system.

Specifically, the light transmitted through the optical system 401 having a wide angle and a large magnification chromatic aberration follows a different optical path for each wavelength according to wavelength dependency of the refractive index, and forms an image at the respective positions on the imaging device 402. Accordingly, the PSF becomes large and the resolution decreases. Therefore, the image processing system 403 needs to perform the magnification-chromatic-aberration correcting process to improve the resolution.

Figure 9:
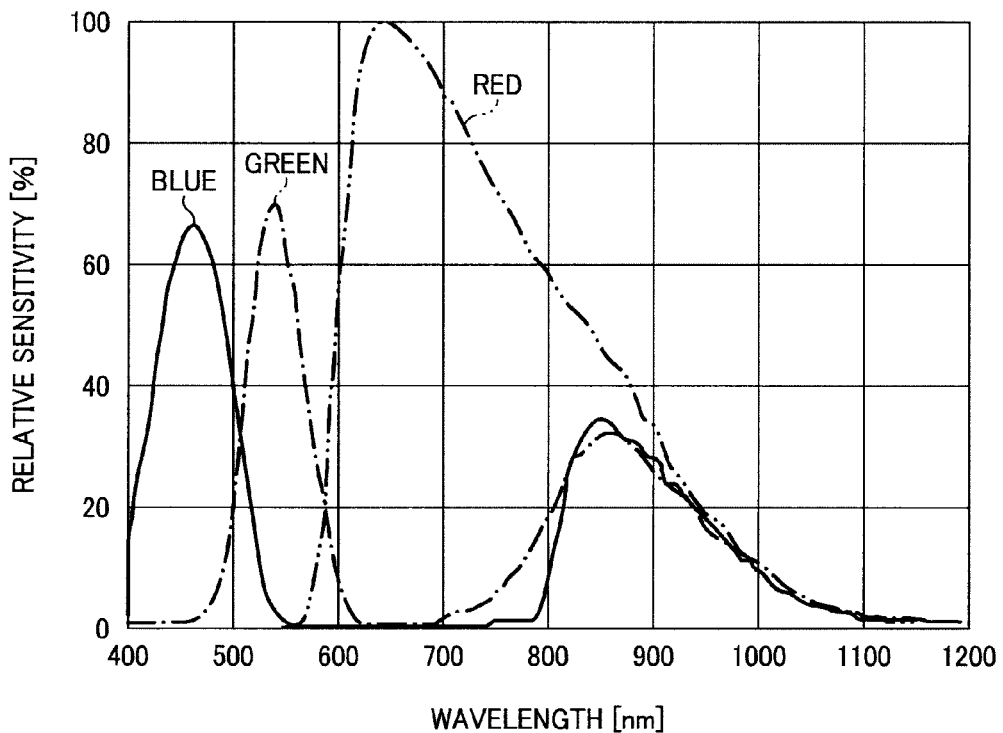
FIG. 9 depicts spectral characteristics of common R, G, and B filters.

A case that a normal imaging device having the R, G, and B color filters is used is considered here. The lights in the R, G, and B wavelength ranges transmit through the R filter, G filter, or B filter at respective imaging points, are converted to the electric charge by the photoelectric conversion element, and is turned into a red signal, green signal, or blue signal. Because the light in the IR wavelength range transmits through the R filter, G filter, and B filter at the imaging point, the light in the IR wavelength range is converted to the electric charge by the photoelectric conversion element and turned into the read signal, green signal, and blue signal. Spectral characteristics of the common R, G, and B filters are shown in FIG. 9.

The magnification chromatic aberrations of the lights in the R, G, and B wavelength ranges can be suppressed by the magnification-chromatic-aberration correcting process (a specific processing method will be described later); however, the light in the IR wavelength range is mixed with the red, green, and blue signals and cannot be separated. Accordingly, the magnification-chromatic-aberration correcting process cannot be performed with respect to the light in the IR wavelength range.

Thus, the light in the IR wavelength range needs to be separated beforehand to perform the magnification-chromatic-aberration correcting process, taking the influence of the light in the IR wavelength range into consideration.

A case that an imaging device that detects and corrects the light in the IR wavelength range, such as devices described in Japanese Patent Applications Laid-open No. 2006-237737 and Japanese Patent Applications Laid-open No. 2008-085807, is considered.

In such an imaging device, subtraction is performed, designating the signal of the detected light in the IR wavelength range as a reference signal, for removing the influence of the light in the IR wavelength range included in the respective color signals output from the pixels having the color filter. Because the red, green, and blue signals not including the light in the IR wavelength range can be obtained, the magnification-chromatic-aberration correcting process can be performed with respect to these signals, thereby enabling to improve the resolution. However, generally in the subtraction, noise increases by a factor of the square root of 2, thereby causing a problem of decreasing the S/N ratio.

The wavelengths in the red wavelength range and the IR wavelength range are similar to each other. Therefore, it is considered that the light in the red wavelength range and the light in the IR wavelength range are equivalent in level of the magnification chromatic aberration, focusing on a fact that a difference in the imaging point between the light in the red wavelength range and the light in the IR wavelength range is smaller than that between the light in the IR wavelength range and the lights in other wavelength ranges. A case that the imaging device according to the present invention (imaging device in the first or second example) is used is considered.

When the imaging device in the first or second example is used, all the lights in the IR wavelength range entering into the imaging device are taken into the R pixel (R+IR pixel) and is converted to the electric charge by the photoelectric conversion element, and a synthesized signal of the light in the IR wavelength range and the light in the red wavelength range is output. On the other hand, the light in the IR wavelength range is not included in the signals of the light in the green wavelength range and the light in the blue wavelength range. That is, the signals output from the R, G, and B pixels can be considered as the signal of the light in the red wavelength range, the signal of the light in the green wavelength range, and the signal of the light in the blue wavelength range, respectively. Therefore, the magnification chromatic aberrations in these three light signals can be suppressed by the magnification-chromatic-aberration correcting process. Further, the sensitivity is high because the light in the red wavelength range and the light in the IR wavelength range entering into the G pixel or B pixel are taken into the R pixel. Furthermore, because the subtraction for removing the influence of the light in the IR wavelength range included in the respective color signals is not performed, the S/N ratio does not decrease.

Further, because the light in the IR wavelength range mixed in the G pixel or B pixel can be removed, the color reproducibility can be improved. The influence of the light in the IR wavelength range that is largely refracted due to the magnification chromatic aberration, forms an image on the imaging device, and is converted to the green signal or blue signal in the G pixel or B pixel at the imaging point can be reduced. Accordingly, the PSF decreases and the resolution can be improved.

Accordingly, even the optical system having a wide angle and a large magnification chromatic aberration can reduce the magnification chromatic aberration, and realize an image having high sensitivity and resolution by a small and low-cost system.

[Explanation of Principle of Magnification-Chromatic-Aberration Correcting Process]

The principle of the magnification-chromatic-aberration correcting process is explained here.

Figure 10:
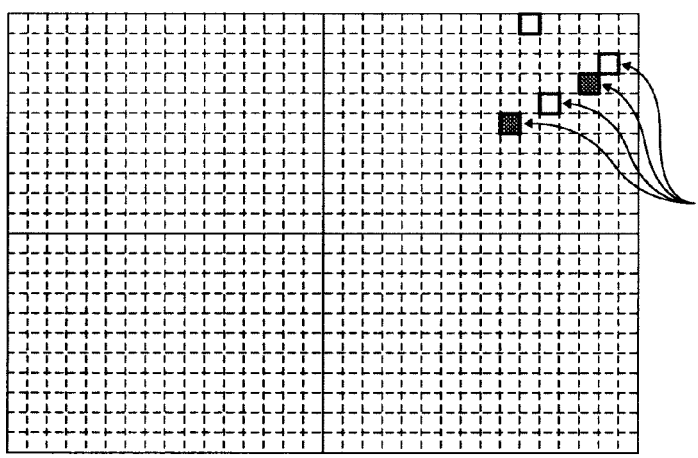
FIG. 10 is a schematic diagram of an obtained image at the time of shooting by using an optical system having a magnification chromatic aberration.

FIG. 10 is a schematic diagram of an image obtained at the time of shooting by using an optical system having a magnification chromatic aberration. Four square points on the upper right of a screen indicate a state that the light is separated into the light in the red wavelength range, the light in the green wavelength range, the light in the blue wavelength range, and the light in the IR wavelength range due to the magnification chromatic aberration with respect to an original position.

Because the size of the magnification chromatic aberration can be seen based on design data of the optical system, it can be calculated to which position the light in the red wavelength range, the light in the green wavelength range, and the light in the blue wavelength range shift from the original position. Accordingly, the luminance at the positions where the light in the red wavelength range, the light in the green wavelength range, and the light in the blue wavelength range form an image on the imaging device can be copied to the original position, that is, coordinate transformation can be performed to correct the magnification chromatic aberration.

A specific configuration example of the image processing system in the imaging apparatus having a magnification chromatic aberration-correcting function is explained.

Figure 11:
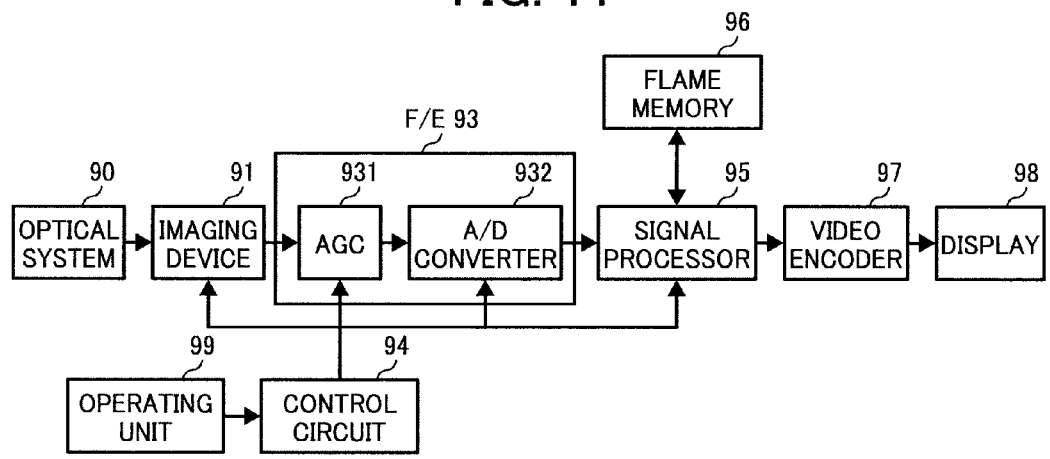
FIG. 11 is a block diagram of one configuration example of an image processing system in the imaging apparatus according to the present invention.

FIG. 11 is a specific configuration example of the image processing system. In FIG. 11, an optical system 90 is a wide-angle lens, for example, and a wide-angle lens previously invented by the present applicants and described in Japanese Patent Application No. 2008-35263 is used. Reference number 91 denotes the imaging device according to the first or second example, and 93 denotes a preprocessor.

The image formed on an image surface by the wide-angle lens is captured by the imaging device 91 and turned into image data. The image formed on the image surface by the wide-angle lens includes a distortion or the magnification chromatic aberration of the wide-angle lens.

The image data output from the imaging device 91 is automatically gain-controlled by an automatic gain controller (AGC) 931 in the preprocessor 93, converted to a digital signal by an A/D converter 932, and turned into digital image data. The AGC 931 is controlled by a control circuit 94 according to an operation of an operating unit 99. Specifically, a charge coupled device (CCD), a complementary metal-oxide semiconductor (CMOS) sensor, or the like is used as the photoelectric conversion element of the imaging device 91.

The digital image data is subjected to image processing by a signal processor 95. The image processing includes processing of a problem resulting from the imaging device 91 and processing of a problem resulting from the wide-angle lens 90.

As a pixel array of the imaging device 91, for example, there is the Bayer array in which the number of pixels of green (G) is larger than the number of pixels of red (R) or blue (B). If image data of R, G, and B is simply taken out and synthesized when each image of R, G, and B is formed, a deviation occurs in each color image due to a deviation in each color pixel array. The signal processor 95 first rearrays these pixels and corrects white balance among R, G, and B pixels. After performing correction involved with the imaging device by this image processing, the signal processor 95 performs correction of the magnification chromatic aberration, the distortion, and modulation transfer function (MTF) degradation, which are image degrading factors resulting from the optical system.

When these processes are performed, the R, G, B image data is stored in a frame memory 96 as an image storage unit. The image data corresponding to an angle of view is read by a memory output controller (the control circuit 94 plays a role thereof in FIG. 11) as required and processed by the signal processor 95.

In the image having undergone the above processes, the influence of the magnification chromatic aberration and the distortion of the wide-angle lens in the optical system is corrected, and the MTF degraded in a peripheral portion of the image is also corrected, and a resultant image is output.

At the time of outputting a still picture, bit map data or a JPEG image is generated from the corrected R, G, B images and output. At the time of outputting a moving picture, an image in a moving picture format such as H.264 or MPEG 2, 4 is generated through a video encoder 97 as shown in FIG. 11 from the respective R, G, B images. The image is converted to NTSC, D2, D4, or a component signal through HDMI or DVI in the case of digital output, or through a D/A conversion circuit in the case of analog output, and output to a display 98, which is an image display unit.

A specific configuration example and a processing method of an image processor used for the signal processor in the image processing system in the imaging apparatus are explained below in detail.

Figure 12:
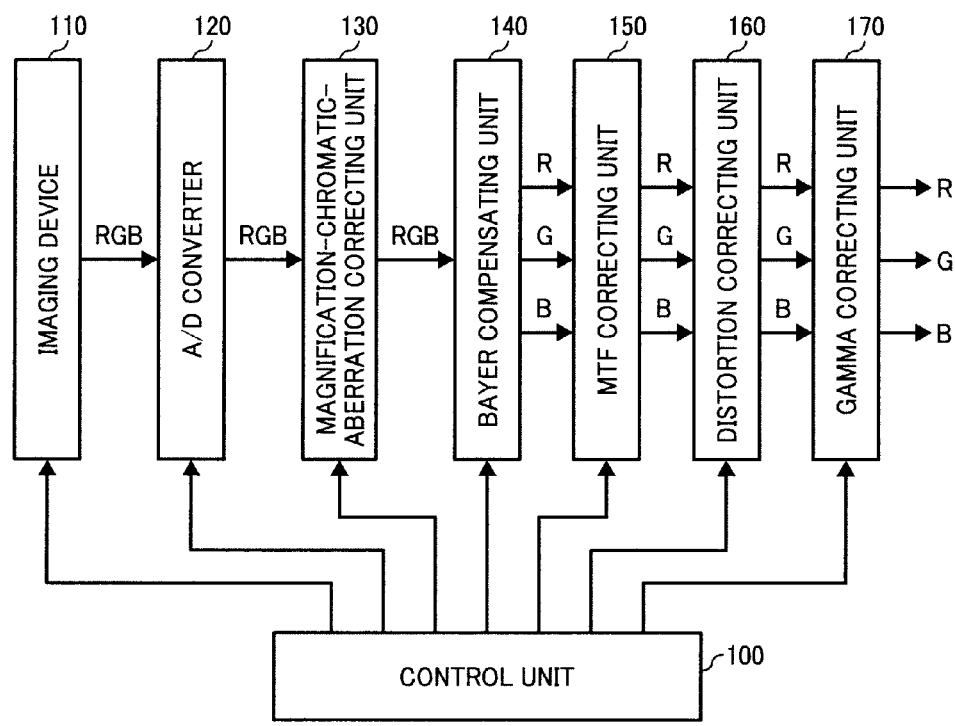
FIG. 12 is a block diagram of a configuration example of a signal processor (image processor) as a major part of the image processing system in the imaging apparatus according to the present invention.

FIG. 12 is a functional block diagram according to one example of the image processing system in the imaging apparatus of the present invention, and mainly depicts a configuration example of the signal processor (image processor). The imaging apparatus includes, as shown in FIG. 11, the operating unit, the image storage unit (frame memory), the image display unit, and the like; however, these are not shown in FIG. 12.

In FIG. 12, a control unit 100 provides required control signals (clock, horizontal/vertical synchronization signal, and the like) to respective units of the apparatus to control the operation of the units in a pipelined manner.

An imaging device 110 includes the photoelectric conversion element (for example, CCD or CMOS sensor) for converting an optical image captured using the optical system (wide-angle lens, not shown) having a wide angle and a large magnification chromatic aberration and distortion into an electric signal (image signal), and the color filter. The imaging device 110 also includes a unit that transfers the light in the wavelength range other than the green and blue wavelength ranges entering into the G pixel and the light in the wavelength range other than the blue and green wavelength ranges entering into the B pixel to the neighboring R pixels. That is, the imaging device 110 is specifically the imaging device explained in the first or second example. The R, G, B pixel array of the imaging device 110 is the Bayer array as shown in FIGS. 2 and 6. The Bayer-arrayed R, G, B image signals are sequentially output based on a coordinate value (x, y) given from the control unit 100. The control unit 100 also gives the coordinate value (x, y) given to the imaging device 110 to a subsequent stage sequentially by shifting a predetermined time. The coordinate value (x, y) can be generated in the imaging device 110 based on the clock and horizontal/vertical synchronization signal and sequentially given to the subsequent stage.

An analog-to-digital (A/D) converter 120 converts the Bayer-arrayed R, G, B image signal, which is an analog signal output from the imaging device 110, into a digital signal (image signal) and outputs the digital signal to a magnification-chromatic-aberration correcting unit 130. For example, the image data includes 8 bits for each of R, G, B. Generally, an AGC circuit is provided at a previous stage of the A/D converter 120 as shown in FIG. 11; however, it is omitted here.

The magnification-chromatic-aberration correcting unit 130 receives Bayer-arrayed R, G, B image data, performs coordinate transformation according to a predetermined equation with respect to the image data of the Bayer array as it is to correct the magnification chromatic aberration, and transmits the magnification chromatic aberration-corrected R, G, B image data of the Bayer array to a Bayer compensating unit 140. Thus, by correcting the magnification chromatic aberration with respect to the Bayer-arrayed R, G, B image data directly, the memory capacity can be one third of that in a conventional case of correcting the magnification chromatic aberration after Bayer interpolation. However, in a simple coordinate transformation, the Bayer array changes before and after the coordinate transformation, and Bayer interpolation cannot be performed correctly in the Bayer compensating unit 140 at a subsequent stage. That is, the Bayer array needs to be maintained before and after the coordinate transformation. Therefore, when the color of the Bayer array of the source is the same as that of the destination, the magnification-chromatic-aberration correcting unit 130 keeps the coordinate of the source as it is. However, when the color of the Bayer array of the source is different from that of the destination, the magnification-chromatic-aberration correcting unit 130 changes the coordinate of the source, for example, to a coordinate of the same color as that of the destination closest thereto. Accordingly, the Bayer array can be maintained even if correction of the magnification chromatic aberration is performed directly with respect to the Bayer-arrayed R, G, B image. The magnification-chromatic-aberration correcting unit 130 will be described later in detail.

The Bayer compensating unit 140 receives the magnification chromatic aberration-corrected R, G, B image data of the Bayer array, generates image data (pixel data) at all coordinate positions by linear interpolation for each color of R, G, B, and outputs the pixel data to an MTF correcting unit 150.

Figure 13A:
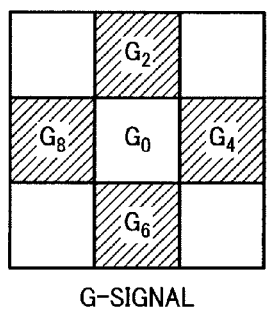
FIGS. 13A to 13C depict example of a color filter with Bayer array.
Figure 13B:
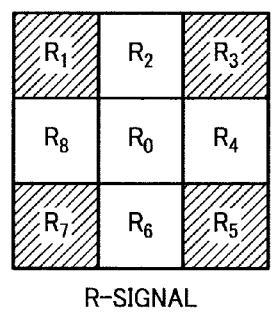
Figure 13C:
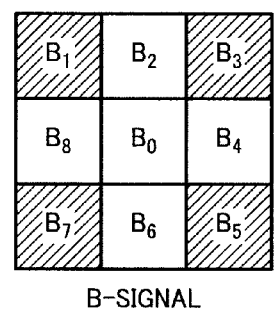

FIG. 13 is an example of a color filter with Bayer array. For convenience sake, R, G, B are separated and shown in FIG. 13; however in practice, R, G, B are integrally arrayed (Bayer-arrayed), where $G_0$ is obtained by Equations (1) to (6).

$$G_0 = (G_2 + G_4 + G_6 + G_8)/4 \quad (1)$$

$$R_2 = (R_1 + R_3)/2 \quad (2)$$

$$R_4 = (R_3 + R_5)/2 \quad (3)$$

$$R_6 = (R_5 + R_7)/2 \quad (4)$$

$$R_8 = (R_1 + R_7)/2 \quad (5)$$

$$R_0 = (R_1 + R_3 + R_5 + R_7)/4 \quad (6)$$

$B_2$, $B_4$, $B_6$, $B_8$, and $B_0$ are the same as the case of $R_2$, $R_4$, $R_6$, $R_8$, and $R_0$.

The MTF correcting unit 150 receives each of the magnification chromatic aberration-corrected and Bayer-interpolated R, G, B image data to perform MTF correction by using an FIR filter and outputs the respective MTF-corrected R, G, B image data.

Figure 14:
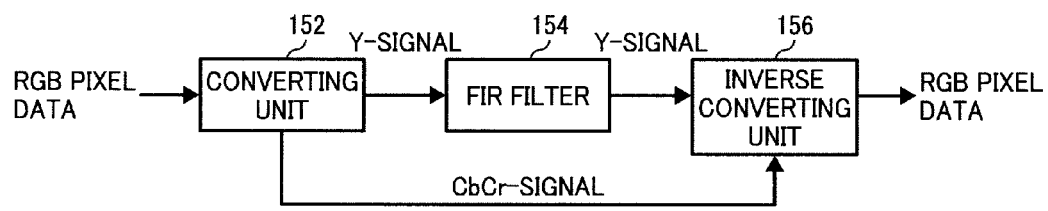
FIG. 14 is a configuration diagram of an example of an MTF correcting unit.

FIG. 14 is a block diagram of the MTF correcting unit 150. A converting unit 152 converts R, G, B image data into YCbCr image data based on Equations (7) to (9).

$$Y = 0.299R + 0.587G + 0.114B \quad (7)$$

$$Cr = 0.500R - 0.419G - 0.081B \quad (8)$$

$$Cb = -0.169R - 0.332G + 0.500B \quad (9)$$

An FIR filter (5×5 filter) 154 receives only a luminance signal Y of YCbCr, and performs predetermined MTF correction. A high quality image with amplification of color noise being suppressed can be obtained by filtering (performing MTF correction) only to the Y-signal. FIG. 15 is a schematic diagram for illustrating an example of the FIR filter. Because the Y-signal is filtered, the MTF correction needs to be performed after the correction of the chromatic aberration of magnification. However, when the MTF correction is performed after the distortion correction, the transformation distance in the coordinate transformation is large in the distortion correction and an arithmetic error easily occurs, as described below. The MTF correction is preferably performed at a subsequent stage of correction of the chromatic aberration of magnification and at a previous stage of the distortion correction as in the present embodiment, to avoid that the error is amplified by the MTF correction to adversely affect the image quality.

An inverse converting unit 156 receives the CbCr-signal and the MTF-corrected Y-signal, and outputs inverse-converted R, G, B image data based on Equations (10) to (12).

$$R = Y + 1.402Cr \quad (10)$$

$$G = Y - 0.714Cr - 0.344Cb \quad (11)$$

$$B = Y + 1.772Cb \quad (12)$$

A distortion correcting unit 160 receives the chromatic aberration of magnification-corrected and MTF-corrected R, G, B image data, performs the coordinate transformation (distortion coordinate transformation) commonly to the respective color components of R, G, B according to a predetermined equation, and outputs the distortion-corrected R, G, B image data. Although the distortion is large, the distortion is uniform for respective color components of R, G, B. Therefore, although a large memory capacity is required for the coordinate transformation in the distortion correcting unit 160, a 1-port memory can be used, and therefore a high-latency memory (DRAM) can be used.

A gamma correcting unit 170 receives the R, G, B image data output from the distortion correcting unit 160, performs predetermined gamma correction by using respective lookup tables or the like of R, G, B, and outputs the gamma-corrected R, G, B image data.

An overall operation of the imaging apparatus according to the embodiment shown in FIG. 12 is as explained above. The magnification-chromatic-aberration correcting unit 130, which is a major configuration of the embodiment, is explained below in detail.

First, the principle of correction of the magnification chromatic aberration of the present invention is explained with reference to FIGS. 16A and 16B. FIG. 16A depicts the Bayer array before coordinate transformation, and FIG. 16B depicts the Bayer array after coordinate transformation. In FIGS. 16A and 16B, the Bayer array has simply 6×6 pixels. However, a resolution VSA has 640×480 pixels, in which the Bayer array in FIGS. 16A and 16B is repeated.

The magnification chromatic aberration shows a different shift for each color component of R, G, B; however, because the magnitude of the magnification chromatic aberration can be seen based on design data of the optical system, it can be calculated to which position each color component of R, G, B shifts. In FIG. 16A, it is assumed that a pixel (G) at a position of coordinate (0, 0) is shifted to a position of coordinate (1, 1), and likewise, a pixel (B) at a position of coordinate (1, 0) is shifted to a position of coordinate (3, 1). Correction of the magnification chromatic aberration is basically realized by copying pixel values of pixels at coordinates (1, 0) and (3, 1) to original positions of coordinates (0, 0) and (1, 0), that is, by performing coordinate transformation. Coordinates (1, 0) and (3, 1) are referred to as a coordinate (X, Y) of a source, and coordinates (0, 0) and (1, 0) are referred to as a coordinate (x, y) of a destination. When a coordinate value is referred to, (x, y) and (X, Y) are referred to as coordinate values, so that the coordinate and the coordinate value are used as appropriate according to need.

As described above, when the coordinate transformation is simply performed with respect to the Bayer-arrayed R, G, B image data, the Bayer array changes before and after the coordinate transformation, and Bayer interpolation cannot be performed correctly at the subsequent stage. Therefore, when the color of the source is the same as that of the destination, the pixel value of the pixel of the source is directly copied to the destination. When the color of the source is different from that of the destination, the coordinate of the source is corrected to a coordinate of the same color as that of the destination and closest to the coordinate of the source, and a pixel value of the pixel at the corrected coordinate is copied to the destination.

In FIG. 16A, the color of the destination at coordinate (0, 0) and the color of the source at coordinate (1, 1) are both green (G). In this case, the pixel value of the pixel (G) at coordinate (1, 1) of the source is directly set as the pixel value of the pixel at coordinate (0, 0) of the destination. On the other hand, the source at coordinate (1, 0) is blue (B) whereas the destination at coordinate (3, 1) is green (G). In this case, the source is corrected to a coordinate of the same color, blue (B), as that of coordinate (1, 0) of the destination and closest to coordinate (3, 1) (in FIG. 16A, coordinate (3, 2)), and the pixel value of the pixel (B) at the corrected coordinate (3, 2) is set as the pixel value of the pixel at coordinate (1, 0) of the destination. Accordingly, as shown in FIG. 16B, the Bayer array after the coordinate transformation is maintained in the Bayer array before the coordinate transformation in FIG. 16A. Three examples are shown below as a specific configuration of the magnification-chromatic-aberration correcting unit 130.

Figure 17:
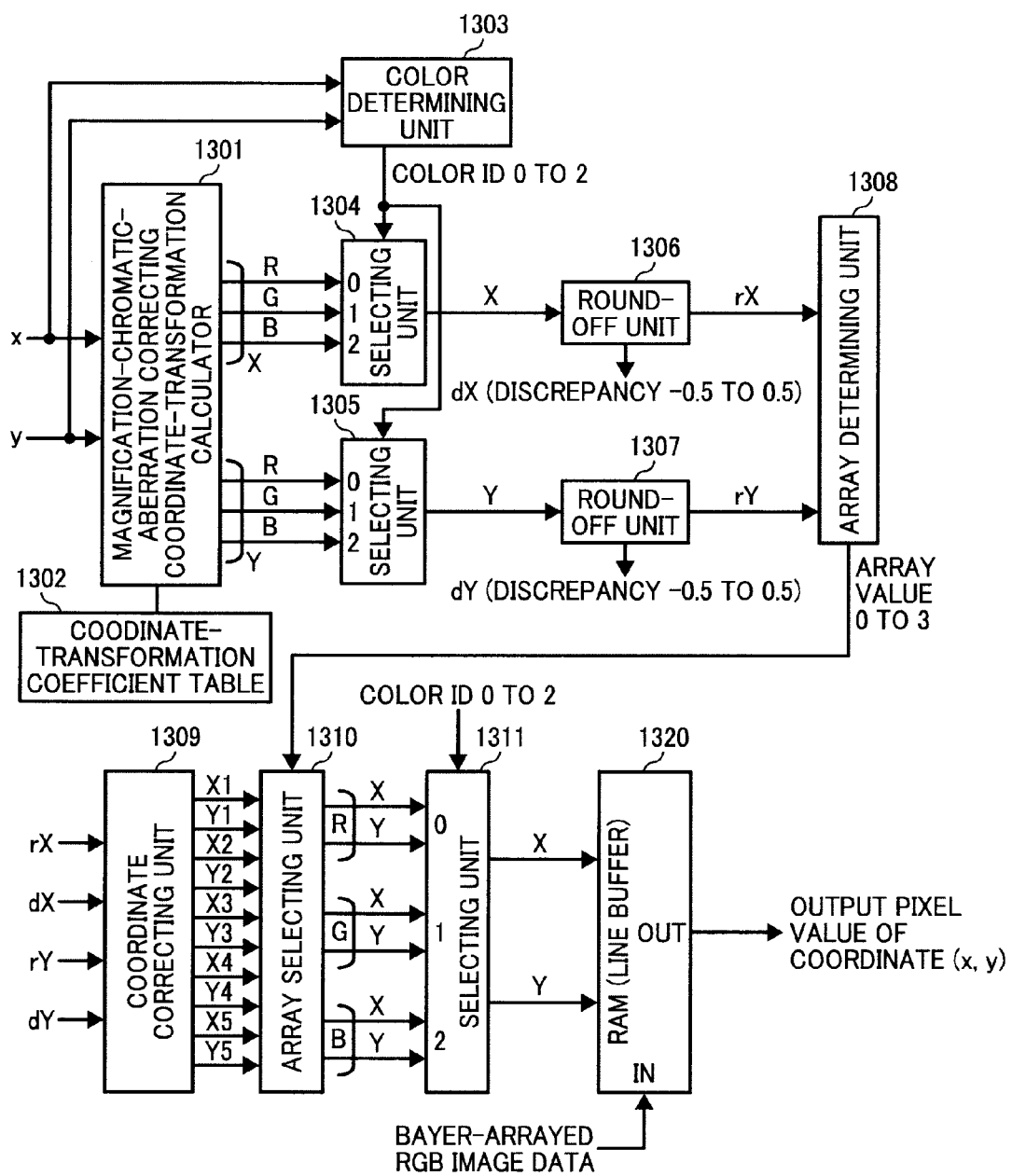
FIG. 17 is an overall configuration diagram of a magnification-chromatic-aberration correcting unit shown in FIG. 12.

FIG. 17 is an overall configuration diagram of the magnification-chromatic-aberration correcting unit 130 according to a first example. As explained by FIGS. 16A and 16B, when the color of the source coordinate is the same as that of the destination coordinate, the pixel value of the pixel of the source coordinate is set as the pixel value of the pixel of the destination coordinate; however, when the color of the source coordinate is different from that of the destination coordinate, a pixel value of a pixel at a coordinate of the same color as that of the destination coordinate closest to the source coordinate is set as the pixel value of the pixel of the destination coordinate. In FIG. 17, a coordinate transforming unit that generates the coordinate value (X, Y) of the source with respect to the coordinate value (x, y) of the destination is constituted by a magnification-chromatic-aberration correcting coordinate-transformation calculator 1301, a coordinate-transformation coefficient table 1302, a color determining unit 1303, selecting units 1304 and 1305, round-off units 1306 and 1307, an array determining unit 1308, a coordinate correcting unit 1309, an array selecting unit 1310, and a selecting unit 1311. A line buffer (coordinate transformation memory) 1320 is constituted by using a 1-port RAM or the like. The line buffer 1320 needs to have the number of lines corresponding to the largest deviation amount in the y direction of the magnification chromatic aberration at least, however, the line buffer 1320 can have more number of lines.

The Bayer-arrayed R, G, B image data with the magnification chromatic aberration and the distortion is sequentially written in the line buffer 1320 in a first-in first-out (FIFO) format from the top line according to the coordinate value (x, y). The magnification chromatic aberration-corrected and Bayer-arrayed R, G, B B image data is sequentially read from the line buffer 1320 based on the coordinate value (X, Y) output from the selecting unit 1311, parallel to the write operation (actually, delayed for predetermined time). That is, the pixel value of the pixel at the coordinate (X, Y) is read as the pixel value of the pixel at the coordinate (x, y). As described later, when the Bayer array color of the coordinate (X, Y) is different from that of the coordinate (x, y), the coordinate (X, Y) is corrected to a coordinate of the same color as that of the coordinate (x, y) closest to the coordinate (X, Y), and therefore the Bayer array of the R, G, B image data output from the line buffer 1320 is maintained. The configuration in FIG. 17 is described below in detail.

The magnification-chromatic-aberration correcting coordinate-transformation calculator 1301 receives the coordinate value (x, y) of the destination to calculate the coordinate value X, Y of the source corresponding to R, G, B according to a predetermined formula of coordinate transformation such as a polynomial, and outputs the coordinate value to the selecting units 1304 and 1305.

When the center of the screen is assumed as the origin, the formula of coordinate transformation can be expressed as, for example, $$X=x+[a(1)+a(2) \times abs(x)+a(3) \times abs(y)+a(4) \times y^2] \times x$$

$$Y=y+[b(1)+b(2) \times abs(y)+b(3) \times abs(x)+b(4) \times x^2] \times y \quad (13)$$

where abs(x) and abs(y) denote an absolute value, a(1) to a(4) and b(1) to b(4) denote coordinate transformation coefficients. The coordinate transformation coefficients are held beforehand in the coordinate-transformation coefficient table 1302.

The color determining unit 1303 receives the coordinate value (x, y), and obtains a color ID corresponding to the color of the coordinate (x, y) of the destination focused in the Bayer array according to a lookup table (LUT) or the like. For example, the color ID is stored beforehand in the LUT, designating the coordinate value (x, y) as an address. The color ID is assumed here as R=0, G=1, and B=2.

Figures 18, 19:
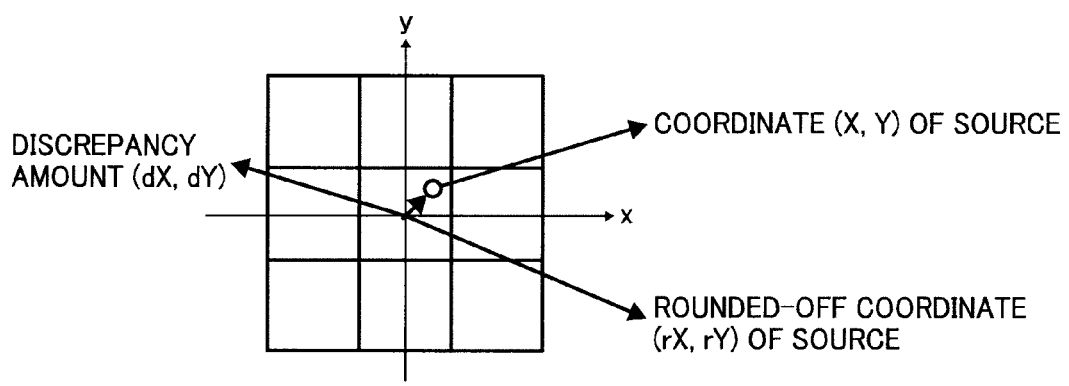
FIG. 18 depicts a relation between a coordinate value of a source, a coordinate value obtained by rounding off the coordinate value, and discrepancies between those.
FIG. 19 is a schematic diagram for explaining an operation by an array determining unit shown in FIG. 17.
Figure 23A:
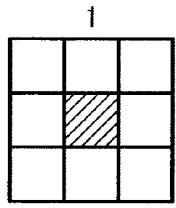
FIGS. 23A to 23E depict a content of calculation performed by a coordinate correcting unit A shown in FIG. 22.
Figure 23B:
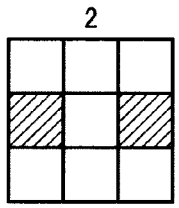
Figure 23C:
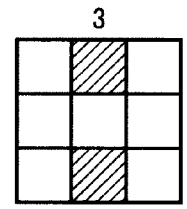
Figure 23D:
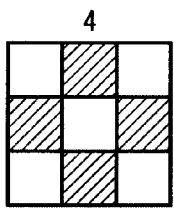
Figure 23E:
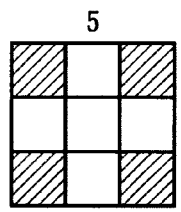
Figure 24A:
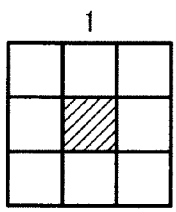
FIGS. 24A to 24E depict a content of calculation performed by a coordinate correcting unit B shown in FIG. 22.
Figure 24B:
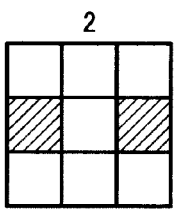
Figure 24C:
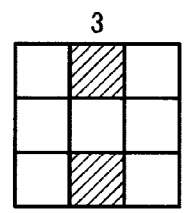
Figure 24D:
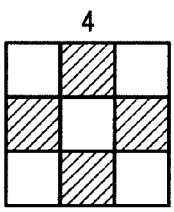
Figure 24E:
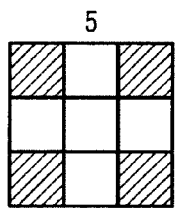
Figure 25A:
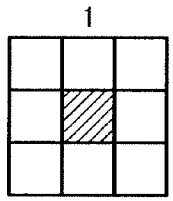
FIGS. 25A to 25E depict a content of calculation in a coordinate correcting unit A of a magnification-chromatic-aberration correcting unit according to a third example.
Figure 25B:
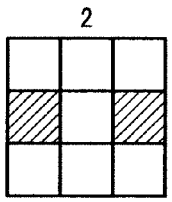
Figure 25C:
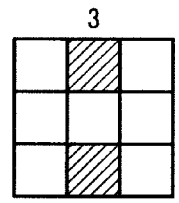
Figure 25D:
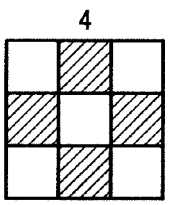
Figure 25E:
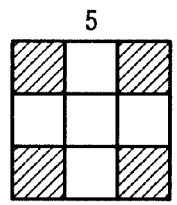
Figure 26A:
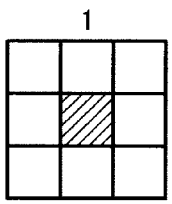
FIGS. 26A to 26E depict a content of calculation in a coordinate correcting unit B of the magnification-chromatic-aberration correcting unit according to the third example.
Figure 26B:
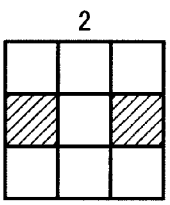
Figure 26C:
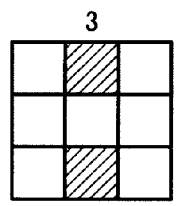
Figure 26D:
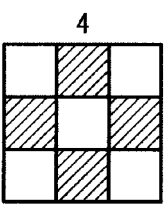
Figure 26E:
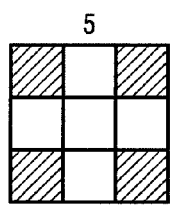

The selecting units 1304 and 1305 select a coordinate value X, Y of one color from the coordinate values X, Y of the source corresponding to R, G, B calculated by the magnification-chromatic-aberration correcting coordinate-transformation calculator 1301 based on the color ID obtained by the color determining unit 1303. The coordinate value X, Y is not limited to an integer according to equation (13). The round-off units 1306 and 1307 round off the coordinate value X, Y selected by the selecting units 1304 and 1305 (to the whole number), and output the integer of the coordinate value rX, rY of the source corresponding to the pixel. Simultaneously, the round-off units 1306 and 1307 output respective discrepancies (differences) dX, dY between X and rX, and Y and rY, where dX and dY take a value of from −0.5 to 0.5. FIG. 18 depicts a relation between the coordinate value X, Y of the source obtained by the calculation, the coordinate value rX, rY obtained by rounding off the coordinate value X, Y, and the discrepancies dX, dY between those. One square surrounded by a frame in FIG. 7 depicts one pixel.

The array determining unit 1308 receives rX, rY and obtains an array value of the focused coordinate (rX, rY) of the source in the Bayer array according to the lookup table. An example of the array value in the Bayer array in FIGS. 16A and 16B is shown in FIG. 19. In FIG. 19, a numerical value described in brackets in each pixel indicates the array value. It is assumed here that the array value is 0 to 3, however, any number can be used so long as the array can be identified.

On the other hand, the coordinate correcting unit 1309 receives rX, rY, dX, and dY and corrects rX and rY according to the values of dX and dY. That is, the coordinate correcting unit 1309 calculates the coordinate value of the source after the correction. The coordinate correcting unit 1309 calculates the coordinate value of the source after the correction, respectively, for all types of array patterns of the same color that can be obtained in the Bayer array.

FIGS. 20A to 20E depict a content of the calculation performed by the coordinate correcting unit 1309. One square surrounded by the frame in FIGS. 20A to 20E indicates a pixel as in FIG. 18. In the Bayer array, the array pattern of the same color is classified into five of 1 to 5 in FIGS. 20A to 20E. The square in the middle of the 3×3 square is the focused source to be corrected. As shown in FIG. 18, the coordinate rX and rY corresponds to a central position of the middle square. The coordinate correcting unit 1309 corrects rX and rY according to dX and dY for respective patterns 1 to 5 in FIGS. 20A to 20E. Specifically, the coordinate correcting unit 1309 performs calculation according to (a) to (e) written below the patterns 1 to 5 in FIGS. 20A to 20E, and outputs X1 and Y1, X2 and Y2, X3 and Y3, X4 and Y4, and X5 and Y5, respectively. That is, the coordinate after the correction indicates any one of shaded squares for respective patterns in FIGS. 20A to 20E.

In FIGS. 20A to 20E, pattern 1 is applied to a case that the destination and the source are the same color. On the other hand, patterns 2 to 5 are applied to a case that the destination and the source are different colors. Pattern 1 is applied to any colors of R, G, B. Patterns 2, 3, and 5 are applied to a case that the color of the source is R or B, and pattern 4 is applied to a case that the color of the source is G.

The array selecting unit 1310 receives X1, Y2, X2, Y2, X3, Y3, X4, Y4, X5, and Y5, and selects the coordinate value X, Y of the source after the correction of respective colors of R, G, and B based on the array value obtained by the array determining unit 1308. FIG. 10 depicts correspondence between the array value and X, Y. For example, when the array value is 0, a set of X3 and Y3 in pattern 3 is designated as X, Y for R, a set of X1 and Y1 in pattern 1 is designated as X, Y for G, and a set of X2 and Y2 in pattern 2 is designated as X, Y for B. The same applies when the array value is 1, 2, or 3.

The selecting unit 1311 receives a set of X, Y of respective colors of R, G, and B, selects a set of X, Y of the same color as that of the destination based on the color ID obtained by the color determining unit 1303, and transmits the set to the line buffer 1320. As a result, the line buffer 1320 reads the pixel value of the pixel at the coordinate (X, Y) as the pixel value of the pixel at the coordinate (x, y). Because the coordinate (X, Y) and the coordinate (x, y) are maintained in the same color, the Bayer array does not change before and after the coordinate transformation.

A specific example of the processing is explained with reference to FIGS. 16A and 16B. A case that the coordinate (x, y) of the destination is (0, 0) and the coordinate (X, Y) of the source is (1, 1) is explained. In this case, the color determining unit 1303 outputs G(1) as the color ID. The magnification-chromatic-aberration correcting coordinate-transformation calculator 1301 calculates (X, Y) for R, G, B, respectively, by inputting the coordinate (0, 0), and the selecting units 1304 and 1305 output (X, Y) of G. The round-off units 1306 and 1307 round off (X, Y), and output (1, 1) as (rX, rY). The array determining unit 1308 outputs 3 as the array value based on FIG. 19. The individual calculation performed by the coordinate correcting unit 1309 is omitted here. The array selecting unit 1310 selects (X2, Y2) as (X, Y) for R, (X1, Y1) as (X, Y) for G, and (X3, Y3) as (X, Y) for B based on FIG. 21. The selecting unit 1311 selects (X1, Y1) of (X, Y) for G, because the color ID is G(1). According to FIGS. 20A to 20E, (X1, Y1)=(rX, rY), and ultimately the coordinate (1, 1) of the source directly becomes an output from the selecting unit 1311. The line buffer 1320 reads the pixel value of the pixel at coordinate (1, 1) as the pixel value of the pixel at coordinate (0, 0).

A case that the coordinate (x, y) of the destination is (1, 0) and the coordinate (X, Y) of the source is (3, 1) is explained next. In this case, the color determining unit 1303 outputs (B(2)) as the color ID. The magnification-chromatic-aberration correcting coordinate-transformation calculator 1301 calculates (X, Y) for R, G, B, respectively, by inputting the coordinate (1, 0), and the selecting units 1304 and 1305 output (X, Y) of B. The round-off units 1306 and 1307 round off (X, Y), and output (3, 1) as (rX, rY). Further, it is assumed that the round-off units 1306 and 1307 output dX=0, dY=+0.2 as the discrepancies dX, dY. The array determining unit 1308 outputs 3 as the array value based on FIG. 19. The individual calculation performed by the coordinate correcting unit 1309 is omitted here. The array selecting unit 1310 selects (X2, Y2) as (X, Y) for R, (X1, Y1) as (X, Y) for G, and (X3, Y3) as (X, Y) for B based on FIG. 21. The selecting unit 1311 selects (X3, Y3) of (X, Y) for B, because the color ID is B(2). According to FIGS. 20A to 20E, (X3, Y3) is such that X3=rX, but Y3=rY+1 in the case of dY>0, otherwise, Y3=rY−1. Because dY=+0.2, (X3, Y3)=(rX, rY+1), and ultimately the output from the selecting unit 1311 becomes (3, 2). The line buffer 1320 reads the pixel value of the pixel at coordinate (3, 2) as the pixel value of the pixel at coordinate (1, 0).

According to the configuration of FIGS. 16A and 16B, when the color of the coordinate of the source is the same as that of the destination, the coordinate of the source is left as it is, and when the color is different from each other, the coordinate of the source can be corrected to a coordinate of the same color as that of the destination and closest to the coordinate of the source. As a result, even if correction of magnification chromatic aberration is performed directly with respect to the Bayer-arrayed R, G, B image data, the Bayer array can be maintained before and after the coordinate transformation. Further, a 1-port RAM can be used as the coordinate transformation memory. Accordingly, in the first example, a cheap 1-port RAM with the memory amount being ⅓ can be used, as compared to the conventional case requiring a 3-port large-capacity memory.

FIG. 22 is an overall configuration diagram of the magnification-chromatic-aberration correcting unit 130 according to a second example. The same as in the first example applies to the second example, when the color of the coordinate of the source is the same as that of the destination. However, when the color is different from each other, two coordinates of the same color as that of the coordinate of the destination near the coordinate of the source are selected, and the pixel value of the pixel corresponding to the coordinate of the destination is interpolated based on the pixel values of the respective coordinates, and the interpolated pixel value is designated as the pixel value of the coordinate of the destination.

In FIG. 22, because the processing in the magnification-chromatic-aberration correcting coordinate-transformation calculator 1301, the color determining unit 1303, the selecting units 1304 and 1305, the round-off units 1306 and 1307, and the array determining unit 1308 is the same as that shown in FIG. 6, explanations thereof will be omitted.

A coordinate correcting unit A 1312 and a coordinate correcting unit B 1315 respectively input rX, rY, dx, dy as in the coordinate correcting unit 1309 in FIG. 17, to calculate the coordinate value of the source after the correction for all types (patterns 1 to 5) that can be obtained for the array patterns of the same color in the Bayer array, that is, calculate the coordinate value of different coordinates such as left and right, above and below, or diagonal of the focused coordinate (dx, dy) of the source to be corrected. Simultaneously, the coordinate correcting unit B 1315 newly calculates a value d as well. As described later, d is used as a weighting coefficient at the time of performing interpolation with respect to the pixels of the two coordinates.

FIGS. 23A to 23E depict a content of calculation performed by the coordinate correcting unit A 1312. The patterns 1 to 5 in FIGS. 23A to 23E are the same as those in FIGS. 20A to 20E. In the second example, the coordinate correcting unit A 1312 receives rX, rY, dX, dY, performs calculation according to (a) to (e) written below the patterns 1 to 5 in FIGS. 23A to 23E, and outputs X1 and Y1, X2 and Y2, X3 and Y3, X4 and Y4, and X5 and Y5, respectively. In pattern 1, the coordinate (rX, rY) (central coordinate) of the source is designated as (X1, Y1) as it is. In pattern 2, the left coordinate of the coordinate (rX, rY) of the source is designated as (X2, Y2). In pattern 3, a coordinate immediately above the coordinate (rX, rY) is designated as (X3, Y3). In pattern 4, the left coordinate of the coordinate (rX, rY) is designated as (X4, Y4) as in pattern 2. A vertical direction is ignored here. In pattern 5, a coordinate at lower left or upper left of the coordinate (rX, rY) is designated as (X5, Y5) according to dY.

FIGS. 24A to 24E depict a content of calculation performed by the coordinate correcting unit B 1315. The coordinate correcting unit B 1315 receives rX, rY, dX, dY, performs calculation according to (a) to (e) written below the patterns 1 to 5 in FIGS. 24A to 24E, and outputs X1 and Y1, X2 and Y2, X3 and Y3, X4 and Y4, and X5 and Y5, respectively. The coordinate correcting unit B 1315 also outputs values d1, d2, d3, d4, and d5 simultaneously. In FIGS. 24A to 24E, pattern 1 is the same as that in FIG. 23A. Patterns 2 to 5 are different from those in FIGS. 23B to 23E. That is, in pattern 2, the right coordinate of the coordinate (rX, rY) (central coordinate) of the source is designated as (X2, Y2), and d2=dx0.5 is also output. In pattern 3, a coordinate immediately below the coordinate (rX, rY) is designated as (X3, Y3), and d3=dY+0.5 is also output. In pattern 4, the right coordinate of the coordinate (rX, rY) is designated as (X4, Y4) as in pattern 2 (ignoring the vertical direction), and d4=dX+0.5 is also output. In pattern 5, a coordinate at lower right or upper right of the coordinate (rX, rY) is designated as (X5, Y5) according to dY, and d5=dX+0.5 is also output. As described later, weighting according to the distance equal to or less than one pixel is performed at the time of performing interpolation with respect to the pixels of the two coordinates, according to d1 to d5.

As described above, pattern 1 is applied to the case that the destination and the source are the same color, and patterns 2 to 5 are applied to the case that the destination and the source are different colors. Pattern 1 is applied to any colors of RGB. Patterns 2, 3, and 5 are applied to the case that the color of the source is R or B, and pattern 4 is applied to the case that the color of the source is G.

An array selecting unit A 1313 receives X1, Y1, X2, Y2, X3, Y3, X4, Y4, X5, Y5 output from the coordinate correcting unit A 1312 and selects a coordinate value X, Y of the source after correction of the respective colors of R, G, and B based on the array value obtained by the array determining unit 1308. A selecting unit A 1314 receives sets of X, Y of the respective colors of R, G, and B output from the array selecting unit A 1313, selects a set of X, Y of the same color as that of the destination based on the color ID obtained by the color determining unit 1303, and transmits the set to the line buffer 1320. The processing in the array selecting unit A 1313 and the selecting unit A 1314 is the same as that in the array selecting unit 1310 and the selecting unit 1311 in FIG. 17.

An array selecting unit B 1316 receives X1,Y1, d1, X2, Y2, d2, X3, Y3, d3, X4, Y4, d4, X5, Y5, d5 output from the coordinate correcting unit B 1315 and selects a coordinate value X, Y of the source after correction of the respective colors of R, G, and B, and a weighting coefficient d based on the array value obtained by the array determining unit 1308. The selecting unit B 1317 receives sets of X, Y, d of the respective colors of R, G, and B output from the array selecting unit B 1316, selects a set of X, Y, d of the same color as that of the destination based on the color ID obtained by the color determining unit 1303, and transmits the set of X, Y to the line buffer 1320, and the weighting coefficient d to a subtracter 1321 and an analog multiplier 1323. The processing in the array selecting unit B 1316 and the selecting unit B 1317 is the same as that in the array selecting unit 1310 and the selecting unit 1311 in FIG. 17; however, a point that the coefficient d is newly output is different.

As described above, the line buffer 1320 needs only to have the number of lines corresponding to the largest deviation amount in the y direction of the magnification chromatic aberration at least, however, the line buffer 1320 can have more number of lines. However, in the second example, the line buffer 1320 is constituted by using a 2 port RAM or the like.

The Bayer-arrayed R, G, B image data with the magnification chromatic aberration and the distortion is sequentially written in the line buffer 1320 in the FIFO format from the top line the according to the coordinate value (x, y). Pixel values of pixels of two different coordinates (X, Y) are read as the pixel value of the pixel corresponding to the coordinate (x, y) from the line buffer 1320 based on the coordinate value (X, Y), based on the coordinates (X, Y) output from the selecting unit A 1314 and the selecting unit B 1317, parallel to the write operation (actually, delayed for predetermined time). According to FIGS. 19, 23, and 24, the two different coordinates (X, Y) and (x, y) are of the same color. The two coordinates (X, Y) become the same coordinate (rX, rY), in the case of the same color pattern 1.

The subtracter 1321 subtracts value d output from the selecting unit B 1317 together with the coordinate (X, Y) from 1. An analog multiplier 1322 multiplies the pixel value of the pixel at the coordinate (X, Y) read from the line buffer 1320 based on the coordinate value (X, Y) from the selecting unit A 1314 by the output value of the subtracter 1321. On the other hand, the analog multiplier 1323 multiplies the pixel value of the pixel at the coordinate (X, Y) read from the line buffer 1320 based on the coordinate value (X, Y) from the selecting unit B 1317 by the value d output from the selecting unit B 1317 together with the coordinate value (X, Y). An adder 1324 adds the output values from the analog multipliers 1322 and 1323 and designates the added value as the pixel value of the pixel at the coordinate (x, y). That is, the pixel value obtained by weighting the pixel values of pixels of two coordinates (X, Y) near the coordinate (rX, rY) of the source according to the weighting coefficient d and adding these pixel values is output from the adder 1324 as the pixel value of the coordinate of the destination. Because the coordinate (X, Y) and the coordinate (x, y) are maintained in the same color, the Bayer array does not change before and after the coordinate transformation.

A specific example of the processing is explained with reference to FIGS. 16A and 16B. A case that the coordinate (x, y) of the destination is (0, 0) and the coordinate (rX, rY) of the source is (1, 1) is explained first. In this case, the selecting unit A 1314 outputs (1, 1) as (X, Y), and the selecting unit B 1317 also outputs (1, 1) as (X, Y), and d=0 simultaneously (halfway processing is omitted). Accordingly, the line buffer 1320 reads the two pixel values of the pixel of the same coordinate (1, 1). Because d=0, an output from the subtracter 1321 is 1, and therefore the analog multiplier 1322 directly outputs the pixel value of the pixel at the coordinate (1, 1). The output of the subtracter 1321 is 0. Ultimately, the adder 1324 outputs the pixel value of the pixel at the coordinate (1, 1) as the pixel value of the pixel at the coordinate (0, 0).

A case that the coordinate (x, y) of the destination is (1, 0) and the coordinate (rX, rY) of the source is (3, 1) is explained next. In this case, the selecting unit A 1314 outputs (3, 0) as (X, Y) (halfway processing is omitted). The selecting unit B 1317 outputs (3, 2) as (X, Y), and d=0.7 (d3=dY+0.5, dY=0.2) simultaneously (halfway processing is omitted). Accordingly, the line buffer 1320 reads a pixel value A of the pixel at the coordinate (3, 0) and a pixel value B of the pixel at the coordinate (3, 2), respectively. Because d=0.7, an output from the subtracter 1321 becomes 0.3, an output from the analog multiplier 1322 becomes 03×A, and an output from the analog multiplier 1323 becomes 0.7×B. The adder 1324 outputs a value obtained by adding the outputs from the analog multipliers 1322 and 1323. Thus, the adder 1324 outputs a pixel value obtained by weighting the pixel values of pixels of the two coordinates (X, Y) according to the weighting coefficient d and adding these pixel values as the pixel value of the pixel at the coordinate (x, y).

According to the configuration in FIG. 22, a 2-port RAM or the like is required for the line buffer. However, when the color of the coordinate of the source is different from that of the destination, the pixel value of the pixel corresponding to the coordinate of the destination is interpolated from the pixel values of the two coordinates of the same color as that of the coordinate of the destination near the coordinate of the source, thereby enabling to improve the image quality at the coordinate of the destination. Of course, the Bayer array is maintained before and after the coordinate transformation.

A pixel value of a pixel corresponding to the coordinate of the destination can be interpolated from the pixel values of three or more coordinates of the same color as that of the coordinate of the destination near the coordinate of the source by extending the configuration of FIG. 22 (for example, pixel values of four pixels are interpolated). In this case, the image quality of the pixel of the destination can be further improved. However, the number of ports of the line buffer increases.

A third example is basically the same as the second example, however, when the color of the coordinate of the source is different from that of the destination, as the two coordinates of the same color as that of the coordinate of the destination near the coordinate of the source, the coordinates are unified to two coordinates in the same direction (x) as a reading direction of the imaging device 110. The overall configuration of the magnification-chromatic-aberration correcting unit 130 is the same as that shown in FIG. 22, and therefore explanations thereof will be omitted. The contents of calculation in the coordinate correcting unit A 1312 and the coordinate correcting unit B 1315 are partly different from those in the second example.

FIGS. 25A to 25E depict the content of calculation in the coordinate correcting unit A 1312, and FIGS. 26A to 26E depict the content of calculation in the coordinate correcting unit B 1315. In FIGS. 25A to 25E, only pattern 3 is different from FIGS. 22 and 23. That is, in patterns 1, 2, 4 and 5, the set of two coordinates (the same coordinate in pattern 1) in the same direction (x) as the reading direction of the imaging device 110 is selected both in FIGS. 22 and 23. In pattern 3, in FIGS. 22 and 23, the set of two coordinates in the y direction is selected. On the other hand, in the third example, as shown in FIGS. 25 and 26, in pattern 3, the same coordinate above or below the coordinate of the source is selected as the set of the two coordinates. The weighting coefficient d3 is set to be 0. Accordingly, interpolation is performed in the same manner as for pattern 1. Therefore, the set of two coordinates in the same direction (x) as the reading direction of the imaging device 110 can be selected in any case of patterns 1 to 5.

When the reading direction of the imaging device 110 is the y direction, the set of two coordinates in the y direction can be selected by changing the calculation contents of the coordinate correcting unit A 1312 and the coordinate correcting unit B 1315.

According to the third example, burst read in the line buffer can be easily performed, and random access to the RAM or the like can be reduced. Therefore, a low-cost and low-speed RAM or the like can be used.

With regard to the configuration of FIG. 12, three examples of the magnification-chromatic-aberration correcting unit 130 have been explained. However, a configuration in which the magnification-chromatic-aberration correcting unit 130 can correct the magnification chromatic aberration and the distortion at the same time can be also used. In this case, the distortion correcting unit 160 can be omitted, and the coordinate transformation memory for correction of the distortion is not required. The configuration in which the magnification chromatic aberration and the distortion are corrected at the same time is basically the same as the configuration shown in FIGS. 17 and 22, and the magnification chromatic-aberration correcting coordinate-transformation calculator 1301 can be changed to a coordinate transformation calculator for correcting the magnification chromatic aberration and the distortion. In this calculator, a coordinate value (x, y) of the destination is input, and a coordinate value obtained by adding the distortion to the magnification chromatic aberration is calculated and output as the coordinate value X, Y of the source corresponding to R, G, B according to a predetermined formula of coordinate transformation. The processing thereafter is basically the same as that explained in the first, second, and third examples.

According to one aspect of the present invention, because much light can be taken into the R pixel, sensitivity can be improved. Further, because the light in the IR wavelength range mixed in the G pixel or B pixel can be removed, the color reproducibility can be improved. Further, the influence of the light in the IR wavelength range that is largely refracted due to the magnification chromatic aberration, forms an image on the imaging device, and is converted to the green or blue signal in the G pixel or B pixel at the imaging point can be reduced. Accordingly, the PSF decreases and the resolution can be improved.

Furthermore, according to another aspect of the present invention, the light in the red wavelength range absorbed by the G filter or B filter is obtained as the red signal, thereby enabling to improve the sensitivity.

Moreover, according to still another aspect of the present invention, a structure for transferring the light in the red wavelength range and the light in the IR wavelength range entering into the G pixel or B pixel to the R pixel neighboring to or bordering on the G or B pixel can be realized.

Moreover, according to still another aspect of the present invention, a structure for transferring the light in the red wavelength range and the light in the IR wavelength range entering into the G pixel or B pixel to the R pixel neighboring to or bordering on the G or B pixel can be realized by using an action of diffracting the light in a specific wavelength of the SWS element.

Furthermore, according to still another aspect of the present invention, a structure for transferring the light in the red wavelength range and the light in the IR wavelength range entering into the G pixel or B pixel to R pixel neighboring to or bordering on the G or B pixel can be realized by using an action of transmitting or reflecting the light in a specific wavelength of the dichroic element.

Moreover, according to still another aspect of the present invention, the sensitivity can be improved by obtaining the light from a horizontal direction in addition to the light entering vertically from above.

Furthermore, according to still another aspect of the present invention, an imaging apparatus having satisfactory color reproducibility, sensitivity, and resolution can be realized.

Moreover, according to still another aspect of the present invention, the magnification chromatic aberration is suppressed, and an image with high sensitivity and resolution can be realized by a small and low-cost optical system.

Furthermore, according to still another aspect of the present invention, by performing the magnification-chromatic-aberration correcting process directly to the image data of the color filter array, the capacity of the coordinate transformation memory used for the magnification-chromatic-aberration correcting process can be reduced.

Moreover, according to still another aspect of the present invention, the color filter array can be maintained before and after the coordinate transformation.

Furthermore, according to still another aspect of the present invention, the image quality can be increased.

Moreover, according to still another aspect of the present invention, when the two coordinates close to the coordinate transformation source are used, a 2-port RAM or the like can be used for the coordinate transformation memory. Because burst read can be used in the memory, a low-cost and low-speed RAM or the like can be used, thereby enabling to realize a low-cost imaging apparatus.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An imaging device comprising:
a photoelectric conversion element including a plurality of light receiving portions;
a color filter provided on a light receiving surface of the photoelectric conversion element with filters for wavelength ranges of red, green, and blue arranged corresponding to the light receiving portions, such that red, green, and blue pixels including the light receiving portions and the filters are arranged in a two-dimensional array; and
a first transfer unit that transfers a light in a wavelength range other than lights in wavelength ranges of green and blue incident on the green pixel and a light in a wavelength range other than lights in wavelength ranges of blue and green incident on the blue pixel to a neighboring red pixel.

2. The imaging device according to claim 1, wherein
the red pixel includes a filter that transmits a light in an infrared wavelength range, and
the transfer unit transfers a light in the infrared wavelength range entering into either one of the green pixel and blue pixel to a red pixel neighboring or near either one of the green pixel and the blue pixel.

3. The imaging device according to claim 1, wherein the first transfer unit has a structure for transferring a light in a red wavelength range and a light in an infrared wavelength range.

4. The imaging device according to claim 1, wherein the first transfer unit is an element that transmits, reflects, or diffracts a light of a specific wavelength.

5. The imaging device according to claim 4, wherein the element is a subwavelength structure element.

6. The imaging device according to claim 4, wherein the element is a dichroic element formed with either one of a dichroic film and a dichroic prism.

7. The imaging device according to claim 6, wherein the red pixel protrudes from levels of the green pixel and the blue pixel with respect to an optical system that forms an image on the light receiving surface.

8. The imaging device according to claim 1, wherein
the pixels are arranged in a Bayer array,
the first transfer unit transfers at least a light in an infrared wavelength range out of the light entering into the green pixel to the neighboring red pixel.

9. The imaging device according to claim 1, wherein
the pixels are arranged in a Bayer array,
the first transfer unit transfers at least a light in an infrared wavelength range out of the light entering into the blue pixel to the neighboring red pixel.

10. An imaging apparatus comprising:
an imaging device including
a photoelectric conversion element including a plurality of light receiving portions,
a color filter provided on a light receiving surface of the photoelectric conversion element with filters for wavelength ranges of red, green, and blue arranged corresponding to the light receiving portions, such that red, green, and blue pixels including the light receiving portions and the filters are arranged in a two-dimensional array, and
a transfer unit that transfers a light in a wavelength range other than lights in wavelength ranges of green and blue incident on the green pixel and a light in a wavelength range other than lights in wavelength ranges of blue and green incident on the blue pixel to a neighboring red pixel;
an imaging optical system that forms an image on the imaging device; and
an image processing system that processes image data output from the imaging device.

11. The imaging apparatus according to claim 10, wherein when the imaging optical system has a wide angle and a large magnification chromatic aberration, the image processing system performs a magnification-chromatic-aberration correcting process with respect to luminance of the green pixel, the blue pixel, and the red pixel including a light in an infrared wavelength range.

12. The imaging apparatus according to claim 11, wherein
the image processing system includes an image processor that processes image data of a color filter array including at least the magnification chromatic aberration from the imaging device, and
the image processor performs the magnification-chromatic-aberration correcting process by performing a coordinate transformation with respect to pixels in the image data of the color filter array including the magnification chromatic aberration, and interpolates a defective pixel due to the color filter array with respect to magnification-chromatic-aberration-corrected image data of the color array.

13. The imaging apparatus according to claim 12, wherein the magnification-chromatic-aberration correcting process is performed in such a manner that when a color of the color filter array of a coordinate transformation source is same as that of a coordinate transformation destination, a pixel value of a pixel of the coordinate transformation source is set as a pixel value of a pixel of the coordinate transformation destination, and when the color of the color filter array of the coordinate transformation source is different from that of the coordinate transformation destination, a pixel value of a pixel of a coordinate of a same color as the coordinate transformation destination closest to the coordinate transformation source is set as the pixel value of the pixel of the coordinate transformation destination.

14. The imaging apparatus according to claim 12, wherein the magnification-chromatic-aberration correcting process is performed in such a manner that when a color of the color filter array of a coordinate transformation source is same as that of a coordinate transformation destination, a pixel value of a pixel of the coordinate transformation source is set as a pixel value of a pixel of the coordinate transformation destination, and when the color of the color filter array of the coordinate transformation source is different from that of the coordinate transformation destination, a pixel value of a pixel corresponding to the coordinate transformation destination is interpolated from pixel values of pixels of a plurality of coordinates of a same color as that of the coordinate transformation destination close to the coordinate transformation source, and an obtained pixel value is set as the pixel value of the pixel of the coordinate transformation destination.

15. The imaging apparatus according to claim 14, wherein there are two coordinates of the same color as that of the coordinate transformation destination close to the coordinate transformation source.

16. The imaging apparatus according to claim 15, wherein the two coordinates are coordinates in a direction same as a reading direction of the imaging device.

17. The imaging apparatus according to claim 12, wherein the magnification-chromatic-aberration correcting process includes a correction of a distortion.

18. The imaging apparatus according to claim 12, wherein a distortion is corrected with respect to the image data in which a defective pixel due to the color filter array in the magnification-chromatic-aberration-corrected image data is interpolated.

* * * * *